(12) United States Patent
Shi et al.

(10) Patent No.: US 12,334,715 B2
(45) Date of Patent: Jun. 17, 2025

(54) VISIBLE LIGHT SOURCE INCLUDING INTEGRATED VCSELs AND INTEGRATED PHOTONIC CAVITIES

(71) Applicant: Meta Platforms Technologies, LLC, Menlo Park, CA (US)

(72) Inventors: Zhimin Shi, Bellevue, WA (US); Maik Andre Scheller, Redmond, WA (US); Gareth Valentine, Kirkland, WA (US); James Ronald Bonar, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 839 days.

(21) Appl. No.: 17/344,738

(22) Filed: Jun. 10, 2021

(65) Prior Publication Data
US 2022/0344907 A1    Oct. 27, 2022

Related U.S. Application Data

(60) Provisional application No. 63/179,913, filed on Apr. 26, 2021.

(51) Int. Cl.
*H01S 5/42*    (2006.01)
*G02F 1/35*    (2006.01)
(Continued)

(52) U.S. Cl.
CPC ............ *H01S 5/423* (2013.01); *G02F 1/3536* (2013.01); *G02F 1/39* (2013.01); *H01S 3/1083* (2013.01);
(Continued)

(58) Field of Classification Search
CPC .......... G02F 1/3536; G02F 1/39; G02F 1/392; H01S 5/142; H01S 5/423; H01S 5/426; H01S 5/42; H04B 10/116
See application file for complete search history.

(56) References Cited

U.S. PATENT DOCUMENTS 9,991,669 B2 *    6/2018   Hirose ..................... H01S 5/185
11,749,964 B2 *   9/2023   Scheller ................ H01S 5/1833
                                                                  372/50.11
(Continued)

FOREIGN PATENT DOCUMENTS

CN            101849334 A       9/2010

OTHER PUBLICATIONS

International Search Report and Written Opinion for International Application No. PCT/US2022/026078, mailed Jul. 29, 2022, 13 pages.
(Continued)

*Primary Examiner* — Rhonda S Peace
(74) *Attorney, Agent, or Firm* — Greenberg Traurig, LLP

(57) ABSTRACT

A visible light source includes a substrate, a first reflector and a second reflector configured to reflect infrared light and arranged vertically to form a vertical cavity on the substrate, an active region in the vertical cavity and configured to emit infrared light, a micro-resonator on the substrate and configured to receive the infrared light emitted by the active region and generate visible light through optical parametric oscillation, and an output coupler configured to couple the visible light generated in the micro-resonator out of the micro-resonator.

20 Claims, 20 Drawing Sheets

(51) Int. Cl.

| | |
|---|---|
| *G02F 1/39* | (2006.01) |
| *H01S 3/108* | (2006.01) |
| *H01S 5/00* | (2006.01) |
| *H01S 5/026* | (2006.01) |
| *H01S 5/04* | (2006.01) |
| *H01S 5/11* | (2021.01) |
| *H01S 5/14* | (2006.01) |
| *H01S 5/183* | (2006.01) |
| *H01S 5/50* | (2006.01) |
| *H04B 10/116* | (2013.01) |

(52) U.S. Cl.
CPC .......... *H01S 5/0064* (2013.01); *H01S 5/0261* (2013.01); *H01S 5/041* (2013.01); *H01S 5/11* (2021.01); *H01S 5/141* (2013.01); *H01S 5/142* (2013.01); *H01S 5/18355* (2013.01); *H01S 5/18377* (2013.01); *H01S 5/5054* (2013.01); *H04B 10/116* (2013.01)

(56) References Cited

U.S. PATENT DOCUMENTS

| 12,126,140 B2 * | 10/2024 | Aoki ........................ H01S 5/11 |
| 2006/0078027 A1 * | 4/2006 | Kim .................... H01S 5/18327 |
| | | 372/50.124 |
| 2011/0148328 A1 | 6/2011 | Joseph et al. |
| 2011/0158278 A1 | 6/2011 | Koch |
| 2019/0371777 A1 | 12/2019 | Iguchi |
| 2021/0080804 A1 | 3/2021 | Liscidini et al. |
| 2021/0408761 A1 * | 12/2021 | Scheller ................. H01S 5/1833 |
| 2022/0344905 A1 * | 10/2022 | Halbritter ............... H01S 5/026 |
| 2022/0344907 A1 * | 10/2022 | Shi ....................... H04B 10/116 |
| 2022/0345220 A1 | 10/2022 | Shi et al. |
| 2023/0198224 A1 * | 6/2023 | Kurosaka .................. H01S 5/42 |
| | | 372/38.05 |
| 2024/0045305 A1 * | 2/2024 | Antognini ............... H01S 3/109 |

OTHER PUBLICATIONS

International Search Report and Written Opinion for International Application No. PCT/US2022/026236, mailed Jul. 28, 2022, 12 pages.

Lu X., et al., "Milliwatt-Threshold Visible-Telecom Optical Parametric Oscillation using Silicon Nanophotonics," Optica, vol. 6, No. 12, Dec. 2019, pp. 1535-1541.

Lu X., et al., "On-Chip Optical Parametric Oscillation into the Visible: Generating Red, Orange, Yellow, and Green from a Near-Infrared Pump," OPTICA, vol. 7, No. 10, Oct. 20, 2020, pp. 1417-1425.

Stern B., et al., "Battery-Operated Integrated Frequency Comb Generator," Nature, vol. 562, No. 7727, Oct. 8, 2018, pp. 401-405.

Stothard D.J.M., et al., "Relaxation-Oscillation-Free Continuous-Wave Optical Parametric Oscillator Pumped Internal to a Semiconductor Disk Laser," Lasers and Electro-Optics, 2009 and 2009Conference on Quantum Electronics Andlaser Science Conference, Jun. 2, 2009, 2 pages.

Machine Translation of CN101849334A, 2010, 11 Pages.

Non-Final Office Action mailed Dec. 11, 2024 for U.S. Appl. No. 17/344,744, filed Jun. 10, 2021, 13 pages.

* cited by examiner

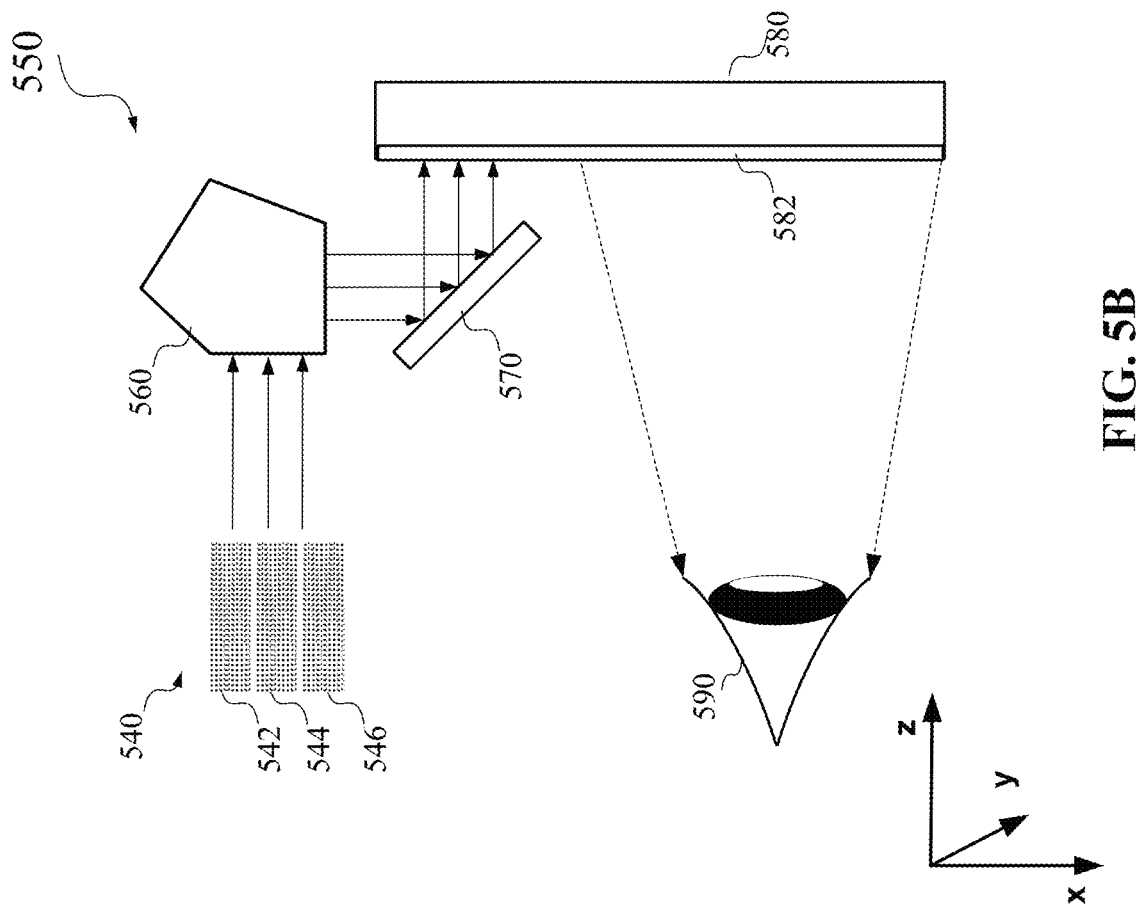
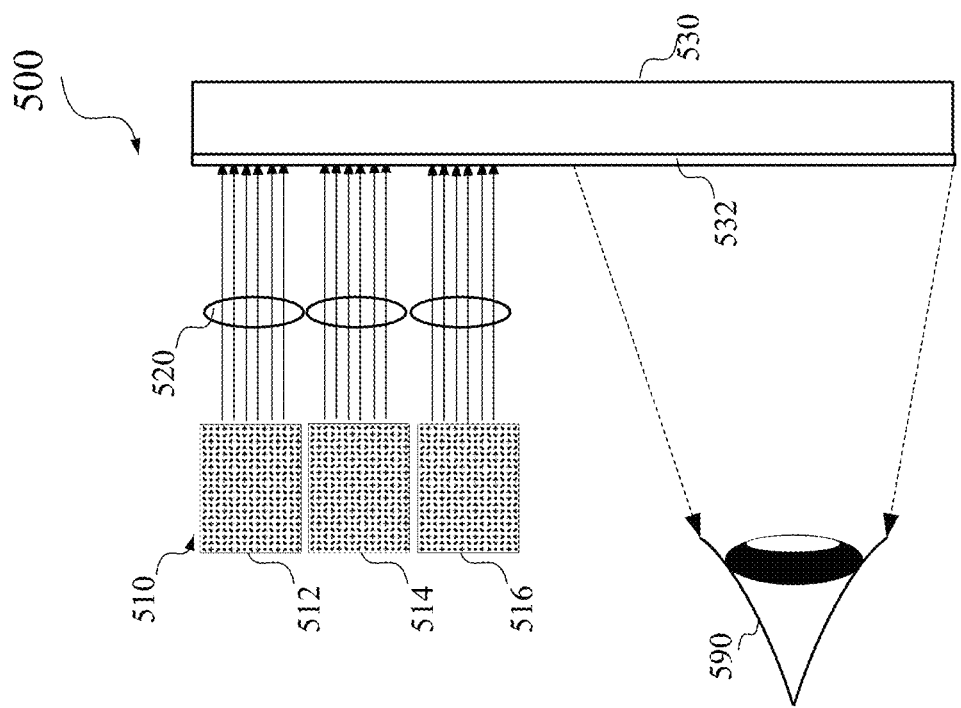
FIG. 5B
FIG. 5A

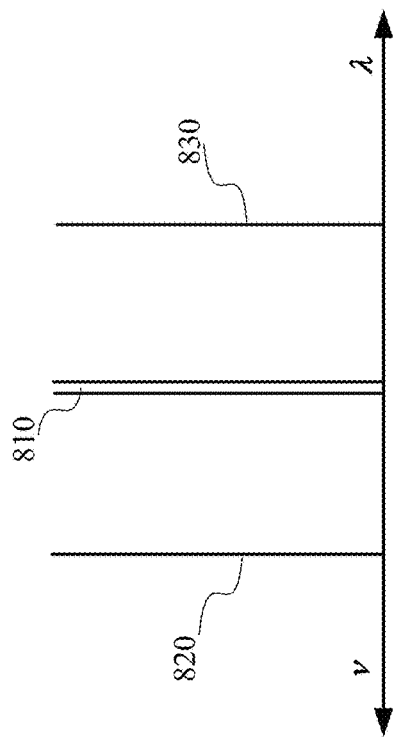
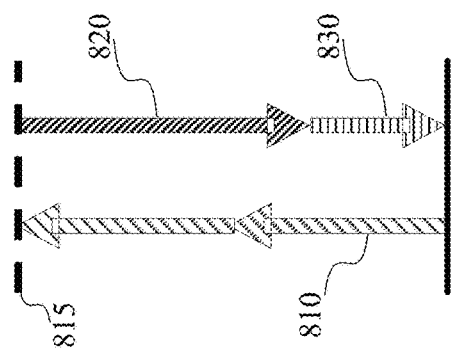
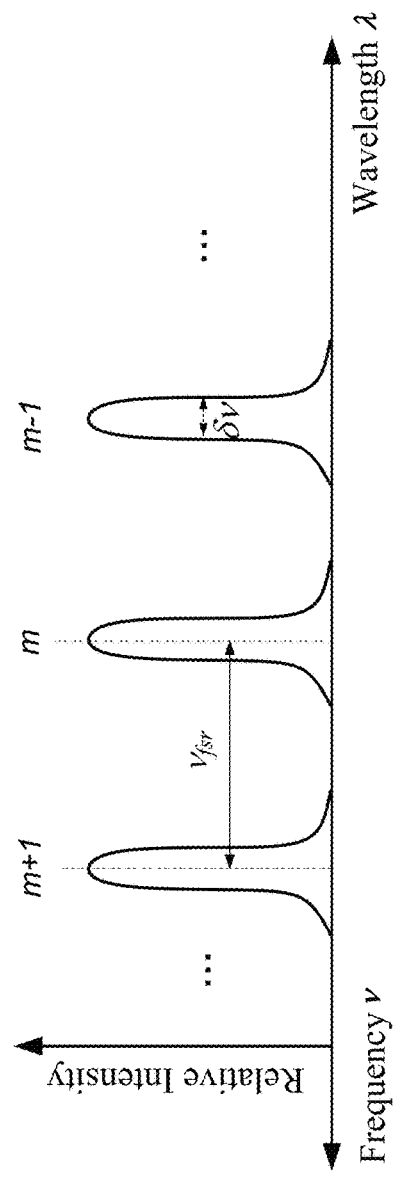

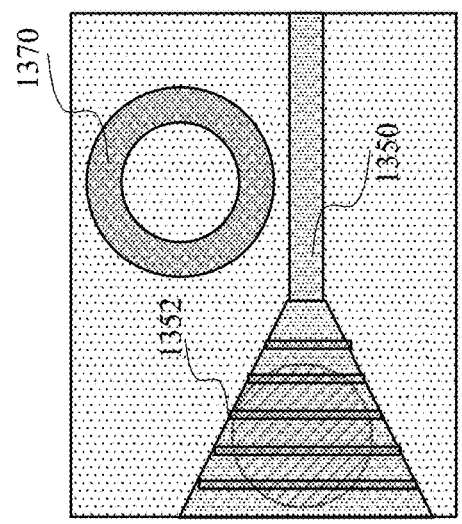
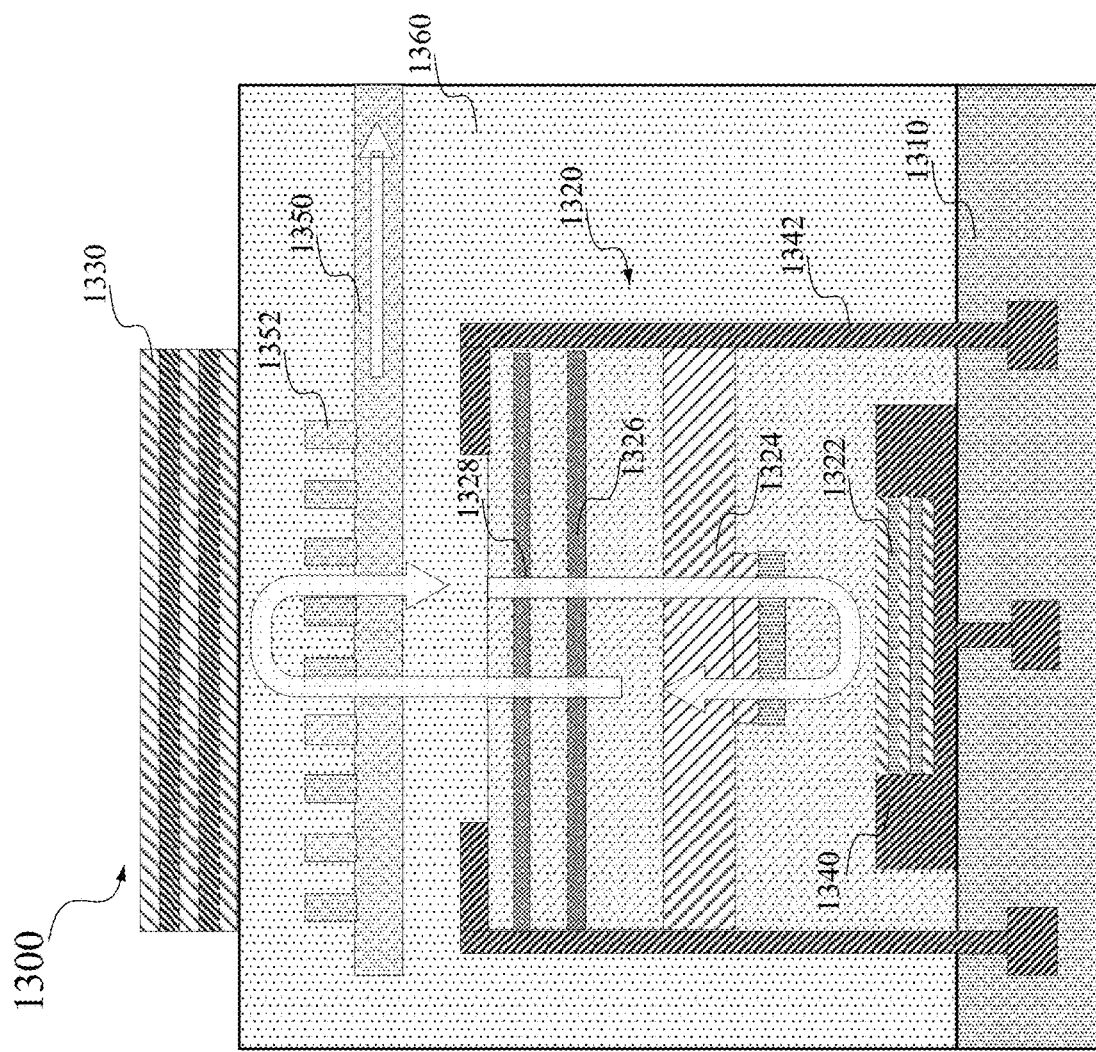
FIG. 13B
FIG. 13A

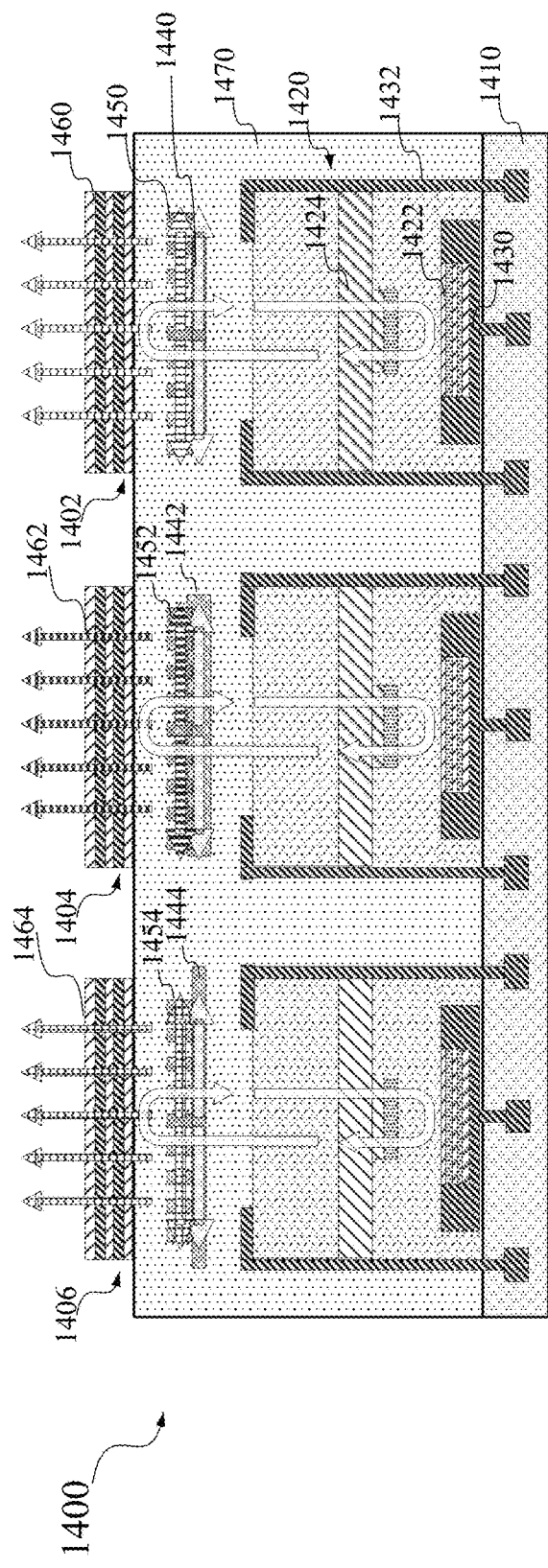
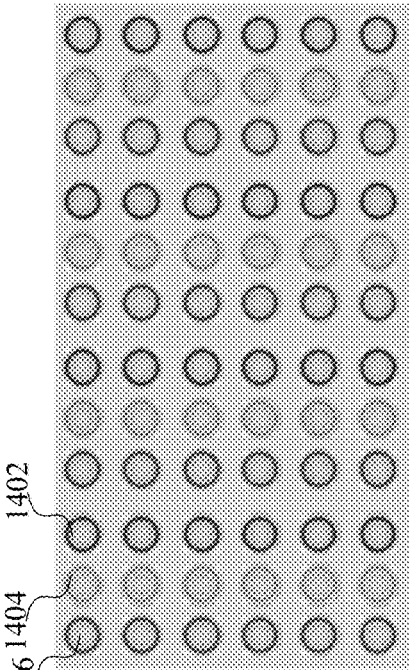
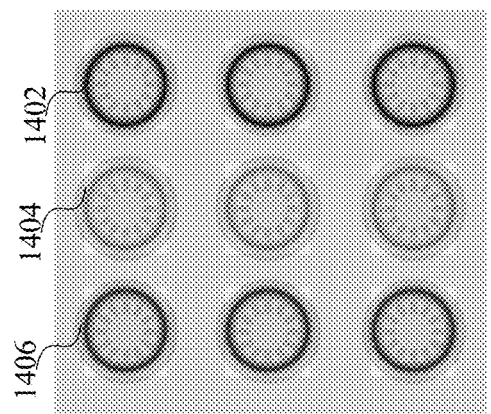
FIG. 14A
FIG. 14B
FIG. 14C

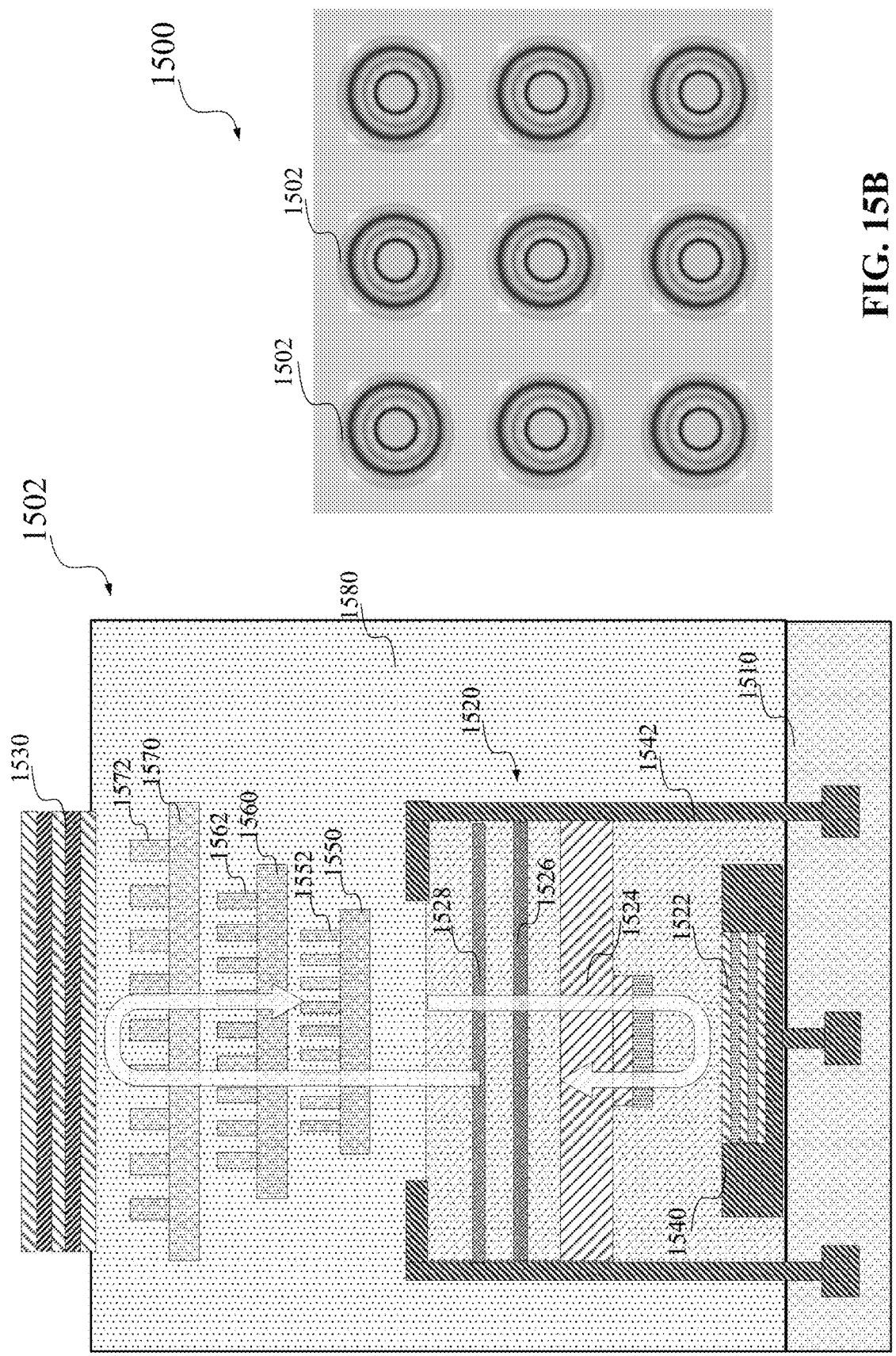

VISIBLE LIGHT SOURCE INCLUDING INTEGRATED VCSELs AND INTEGRATED PHOTONIC CAVITIES

CROSS-REFERENCE TO RELATED APPLICATIONS

This patent application claims benefit of and priority to U.S. Provisional Patent Application Ser. No. 63/179,913, filed Apr. 26, 2021, entitled "VISIBLE LIGHT SOURCE INCLUDING INTEGRATED VCSELS AND INTEGRATED PHOTONIC CAVITIES," the disclosure of which is hereby incorporated by reference in its entirety for all purposes. The following two U.S. patent applications (including this one) are being filed concurrently, and the entire disclosure of the other application is incorporated by reference into this application for all purposes:

- U.S. patent application Ser. No. 17/344,738, filed Jun. 10, 2021, entitled "VISIBLE LIGHT SOURCE INCLUDING INTEGRATED VCSELS AND INTEGRATED PHOTONIC CAVITIES"; and
- U.S. patent application Ser. No. 17/344,744, filed Jun. 10, 2021, entitled "MULTI-COLOR VISIBLE LIGHT SOURCE INCLUDING INTEGRATED VCSELS AND INTEGRATED PHOTONIC CAVITIES."

BACKGROUND

Semiconductor light-emitting devices, such as light-emitting diodes (LEDs), micro-LEDs, resonant cavity LEDs (RCLEDs), vertical-cavity surface-emitting lasers (VCSELs), and vertical external cavity surface emitting lasers (VECSELs), convert electrical energy into optical energy, and offer many benefits over other light sources, such as reduced size, improved durability, and increased efficiency and brightness. Semiconductor light-emitting devices can be used as light sources in many display systems, such as televisions, computer monitors, laptop computers, tablets, smartphones, projection systems, and wearable electronic devices. For example, micro-LEDs or VCSELs that emit light of different colors (e.g., red, green, and blue) can be used to form the sub-pixels of a display panel in a display system, such as a near-eye display system. Micro-LEDs, VCSELs, and other semiconductor light-emitting devices can also be deployed in various sensor systems, such as systems for depth sensing, three-dimensional sensing, object tracking (e.g., hand tracking or face tracking), and the like.

SUMMARY

This disclosure relates generally to visible light sources. More specifically, and without limitation, this disclosure relates to integrated vertical-cavity surface-emitting lasers (VCSELs) pumped visible light sources including optical resonators configured to generate visible light through optical parametric oscillation (OPO). Visible light sources disclosed herein may be used in, for example, backlight unit (BLU) displays and active display panels. Various inventive embodiments are described herein, including devices, components, systems, methods, structures, materials, processes, and the like.

According to certain embodiments, a visible light source may include a substrate; a first reflector and a second reflector on the substrate, where the first reflector and the second reflector are configured to reflect infrared light and are arranged vertically to form a vertical cavity; an active region in the vertical cavity and configured to emit infrared light; a micro-resonator on the substrate and configured to receive the infrared light emitted by the active region and generate visible light through optical parametric oscillation; and an output coupler configured to couple the visible light generated in the micro-resonator out of the micro-resonator.

According to certain embodiments, a visible light source array may include a CMOS backplane including drive circuits formed thereon, and an array of visible light sources formed on a substrate and bonded to the CMOS backplane directly or indirectly. Each visible light source in the array of visible light sources is individually addressable by the drive circuits and comprises: a first reflector and a second reflector configured to reflect infrared light and form a vertical cavity; an active region in the vertical cavity and configured to emit infrared light; a micro-resonator configured to receive the infrared light emitted by the active region and generate visible light through optical parametric oscillation; and an output coupler configured to couple the visible light generated in the micro-resonator out of the micro-resonator.

According to certain embodiments, a visible light source may include a substrate; a vertical-cavity surface-emitting laser on the substrate and comprising an active semiconductor region configured to emit infrared light and a first reflector configured to reflect the infrared light emitted by the active semiconductor region; a second reflector configured to reflect the infrared light, the first reflector and the second reflector forming a vertical cavity for the infrared light; one or more micro-resonators on the substrate and configured to receive the infrared light and generate visible light in one or more colors using the infrared light through optical parametric oscillation; and one or more output couplers configured to couple the visible light in one or more colors from the one or more micro-resonators into free space or into a photonic integrated circuit.

According to certain embodiments, a visible light source array may include a substrate including drive circuits formed thereon; and a die or a wafer bonded to the drive circuits directly or indirectly. The die or wafer may include an array of visible light sources formed thereon. Each visible light source in the array of visible light sources is individually addressable by the drive circuits and comprises: a vertical cavity formed by a first reflector and a second reflector, the first reflector and the second reflector configured to reflect infrared light; an active region in the vertical cavity and configured to emit infrared light; one or more micro-resonators configured to receive the infrared light and generate visible light in one or more colors using the infrared light through optical parametric oscillation; and one or more output couplers configured to couple the visible light in one or more colors from the one or more micro-resonators into free space or one or more waveguides.

According to certain embodiments, a visible light source array may include a substrate including drive circuits formed thereon, and a die or a wafer bonded to the drive circuits directly or indirectly. The die or wafer may include an array of visible light sources formed thereon. Each visible light source in the array of visible light sources is individually addressable by the drive circuits and comprises: a vertical cavity formed by a first reflector and a second reflector, the first reflector and the second reflector configured to reflect infrared light; an active region in the vertical cavity and configured to emit infrared light; a micro-resonator configured to receive the infrared light and generate visible light using the infrared light through optical parametric oscillation; and an output couplers configured to couple the visible light in from the micro-resonator into free space or a waveguide. A first micro-resonator in a first visible light source of the visible light source array and a second micro-resonator in a second visible light source of the visible light source array may have different sizes, different shapes, different materials, or a combination thereof, and are configured to generate visible light of different colors.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments. FIG. 5B illustrates an example of a near-eye display device including a waveguide display according to certain embodiments.

FIGS. 8A and 8B illustrate an example of generating a higher frequency light signal using lower frequency pump light through degenerate four-wave mixing. FIG. 8C illustrates multiple longitudinal resonant modes of an example of a micro-resonator.

FIG. 13A illustrates an example of a visible light source including a micro-resonator pumped by an infrared light VCSEL in a vertical cavity according to certain embodiments, where the infrared light is coupled into the micro-resonator through an input coupling structure in the vertical cavity and a waveguide on a same vertical layer as the micro-resonator. FIG. 13B illustrates a top view of the example of the visible light source of FIG. 13A.

FIG. 14A illustrates an example of an array of visible light sources configured to emit visible light of different colors according to certain embodiments, where each visible light source in the array includes a micro-resonator in a vertical cavity and directly pumped by an infrared light VCSEL in the vertical cavity, and the visible light generated in the micro-resonator is vertically coupled out of the vertical cavity. FIGS. 14B and 14C illustrate top views of examples of the array of visible light sources of FIG. 14A.

FIG. 15A illustrates an example of an array of visible light sources according to certain embodiments, where each visible light source in the array is configured to generate visible light of different colors. FIG. 15B illustrates a top view of the example of the array of visible light sources of FIG. 15A.

Figure 1:
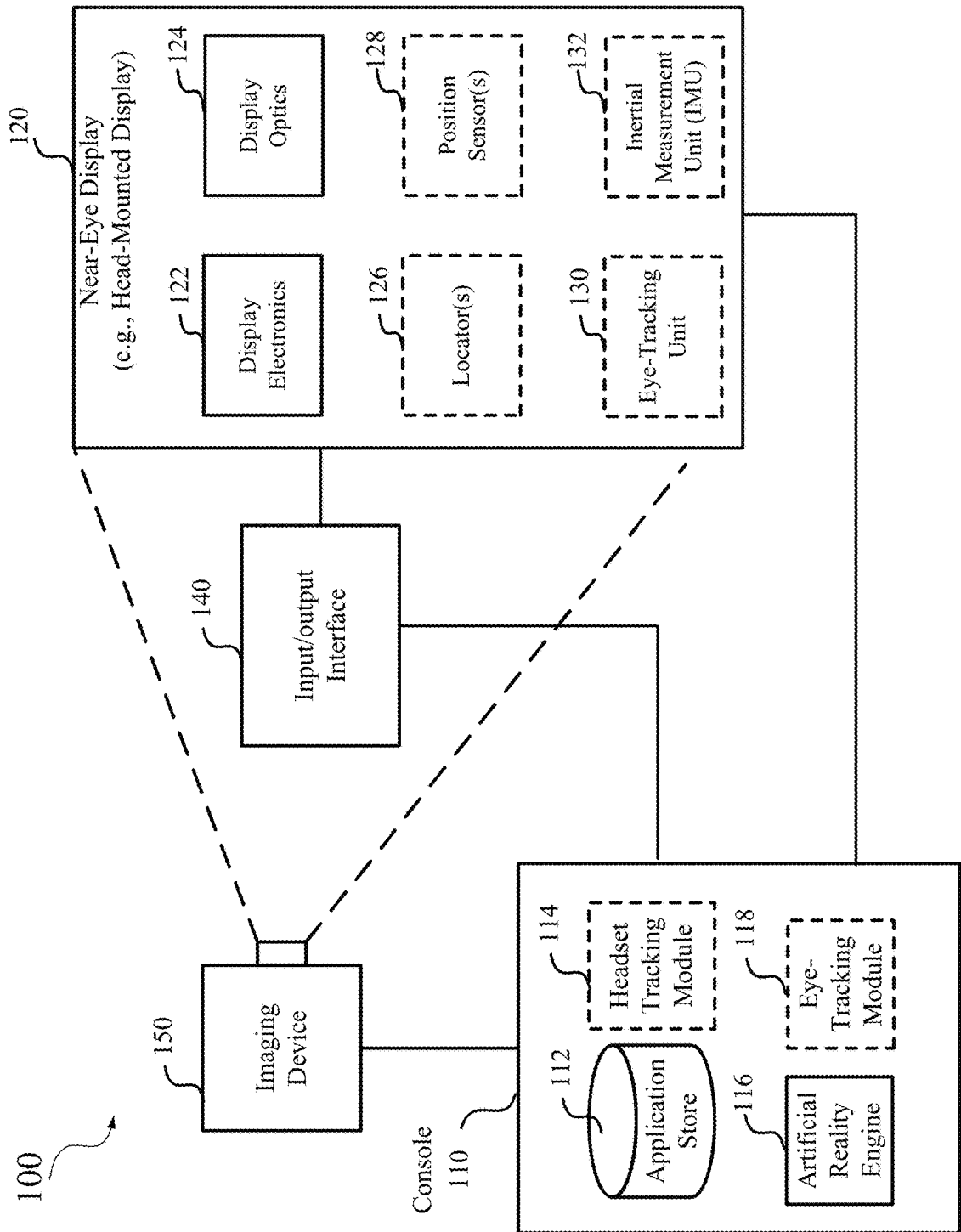
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to visible light sources. More specifically, and without limitation, this disclosure relates to integrated vertical-cavity surface-emitting lasers (VCSELs) pumped visible light sources including optical resonators configured to generate visible light using infrared through optical parametric oscillation (OPO). Various inventive embodiments are described herein, including devices, systems, components, wafers, dice, methods, structures, materials, processes, and the like.

Semiconductor light-emitting devices may be used in many optical systems, such as display systems and sensor systems. For example, in some display systems, visible display light emitted from a visible light source (e.g., a diode laser array or a micro-light-emitting diode (micro-LED) array) may be directed projected to user's eyes. In waveguide display systems, visible display light emitted from a visible light source may be coupled into a display (e.g., a waveguide display) for delivering images to a viewer's eyes. The overall efficiency $\eta_{tot}$ of a waveguide display system may be determined by $\eta_{tot}=\eta_{EQE}\times\eta_{in}\times\eta_{out}$, where $\eta_{EQE}$ is the external quantum efficiency (EQE) of the light source (e.g., a laser or micro-LED) and may be proportional to a product of the carrier (e.g., electron) injection efficiency, the internal quantum efficiency, and the light extraction efficiency (LEE). $\eta_{in}$ is the in-coupling efficiency of the visible display light from the light source into the waveguide. $\eta_{out}$ is the out-coupling efficiency of the visible display light from the waveguide towards the viewer's eye. To improve, for example, the brightness, resolution, and efficiency of an optical system (e.g., a display system), visible light source arrays with small pixel pitches (e.g., less than about 20 or about 10 μm), high brightness, high dynamic range, controllable emission direction, individual addressability, large color Gamut, and manufacture scalability are generally desired.

However, it can be challenging to make such visible light sources. For example, LEDs and organic LEDs (OLEDs) may have fundamental limitations in brightness. It can be very difficult to make VCSELs with high efficiencies for some visible colors (e.g., green). It can be even more challenging to manufacture visible-light laser sources for multiple colors on a same chip or wafer. Furthermore, current visible light source architectures may typically have large footprints and may not be suitable for individually addressable high-density source array for high resolution display. Integration of III-V semiconductor devices with photonic integrated circuits (PICs) can pose additional manufacturing challenges.

According to certain embodiments, a visible light source may include an VCSEL that may emit light in the near-infrared (NIR) or other infrared (IR) band with a high efficiency. The NIR light may be generally referred to as IR light hereinafter. The visible light source may also include a micro-resonator that may convert the IR light into visible light due to degenerate four-wave mixing (a third order nonlinear optical process also referred to as Optical Parametric Oscillation (OPO)) within the micro-resonator. In some embodiments, the micro-resonator may be positioned inside or outside the VCSEL cavity and aligned with the VCSEL, where the IR light emitted by the VCSEL may be coupled into the micro-resonator directly or by a coupling structure (e.g., a grating coupler or nano-resonators). In some embodiments, the IR light emitted by the VCSEL may be coupled into a waveguide by a coupling structure (e.g., a grating coupler or nano-resonators) and may then be coupled from the waveguide into the micro-resonator, for example, through a waveguide coupler. The micro-resonator may include, for example, a micro-ring resonator, a photonic crystal point defect cavity, a photonic crystal ring (line-defect) cavity, a plasmonic resonator, and the like. Visible light generated by the degenerate four-wave mixing in the micro-resonator may be coupled out of the micro-resonator into a waveguide through side coupling or into free space through vertical coupling by coupling structures (e.g., gratings, or dielectric or metallic scatterers placed in the vicinity of the micro-resonator).

In some embodiments, a device may include an array of visible light sources, where the visible light sources may emit visible light of different colors, such as red, blue, and green. In one example, each visible light source may include one micro-resonator, and the micro-resonators (and/or the VCSELs) in some visible light sources may be different from the micro-resonators (and/or the VCSELs) in some other visible light sources, such that different visible light sources may emit light of different colors. In some embodiments, each visible light source in the array of visible light source may be configured to, or may be configurable to, emit light of different colors. In one example, each visible light source of the array of visible light sources may include a pump VCSEL and multiple micro-resonators (e.g., arranged vertically) having different parameters, where each of the multiple micro-resonators may be configured to generate visible light of a different color, and, in some embodiments, each micro-resonator of the multiple micro-resonators may be tuned (e.g., by a thermal-optic or electro-optic tuner) to independently adjust the intensity of the corresponding visible light generated by the micro-resonator. In some embodiments, a visible light source in the array of visible light sources may include a pump VCSEL that has a tunable cavity and can be tuned to emit pump light having different wavelengths, and the visible light source may also include a micro-resonator having multiple resonant modes and thus can generate visible light of different colors using the pump light having different wavelengths.

Techniques disclosed herein may achieve performance needed for display applications. For example, because of the vertical configuration of each visible light source and the compactness of the arrangement of the visible light source array, a small-pitch, multi-color pixelated array may be achieved, which can be used as a backlight unit (BLU) with local dimming capability for liquid crystal displays (LCDs), or can be used as an active display panel. The polarization of the output light from the visible light source is highly controllable, for example, by the design of the output coupling structures (e.g., gratings, scatterers, etc.). The structure of the visible light source can be designed to generate light at any visible wavelength using the OPO process, and thus can be used to provide International Telecommunication Union (ITU) Recommendation BT.2020 (Rec. 2020) color gamut or an even larger gamut by producing more than 3 primary colors. The direct electronic control of each visible light source can provide individual addressability, high contrast, and fast response. The integration of the pump light and the OPO components provides an overall compact, low profile, planar structure suitable for AR/VR applications. When side coupling is used, the visible light sources disclosed herein can also be used to provide red, green, and blue light to other on-chip photonic integrated circuits.

In addition, visible light sources disclosed herein can have scalable manufacturability. For example, visible light sources disclosed herein can be manufactured using established integration techniques for integrating (e.g., bonding) near-infrared (NIR) VCSELs with SiN, SiC, AlN, $LiNbO_3$, or SiON materials for photonic integrated circuits. Visible light sources disclosed herein use VCSEL structures that are suitable for substrate lift-off to enable integration. The pixelated arrays can be fabricated at a scalable, wafer level, including the fabrication of VCSELs and PIC devices, the bonding, or the like.

As used herein, visible light may refer to light that is visible to human eyes, such as light with a wavelength between about 400 nm and about 750 nm. Infrared light may refer generally to light with a wavelength greater than about 750 nm. Near-infrared (NIR) light may refer to IR light with a wavelength between, for example, about 750 nm and about 2500 nm.

The visible light sources described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light-emitting diode (OLED) display, an inorganic light-emitting diode (ILED) display, a micro light-emitting diode (µLED) display, an active-matrix OLED display (AMO-LED), a transparent OLED display (TOLED), or some other displays. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light-emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
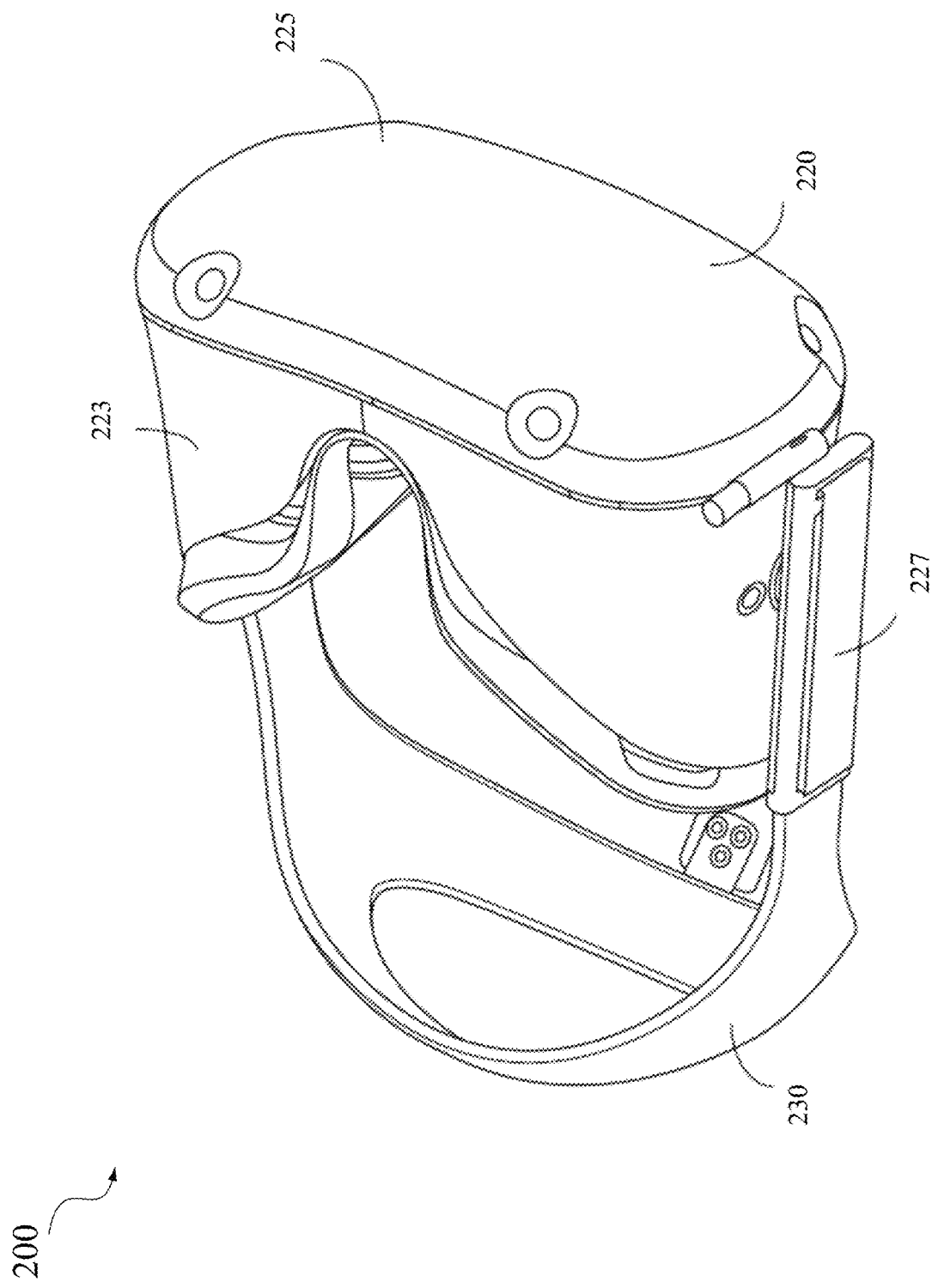
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
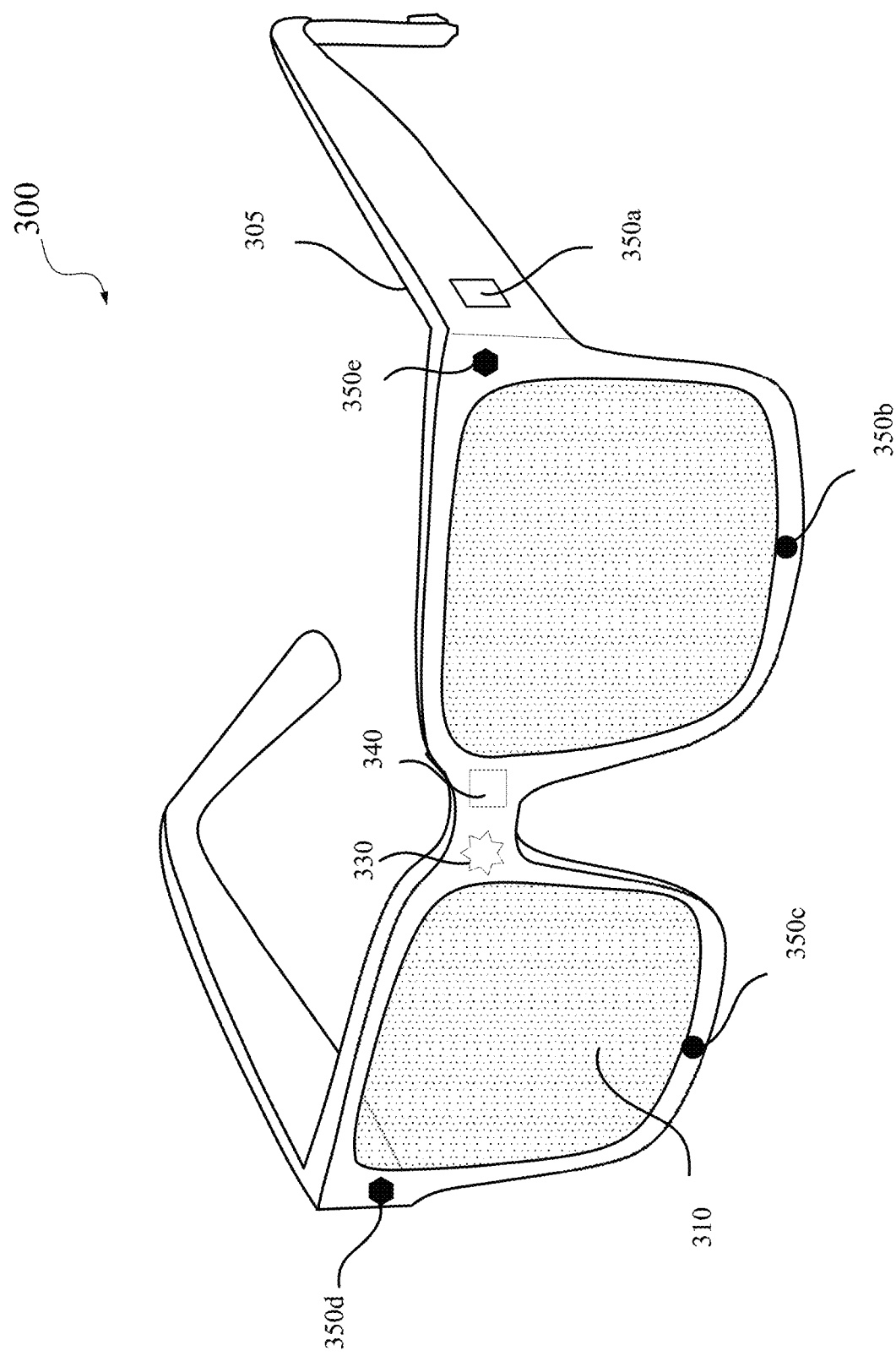
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
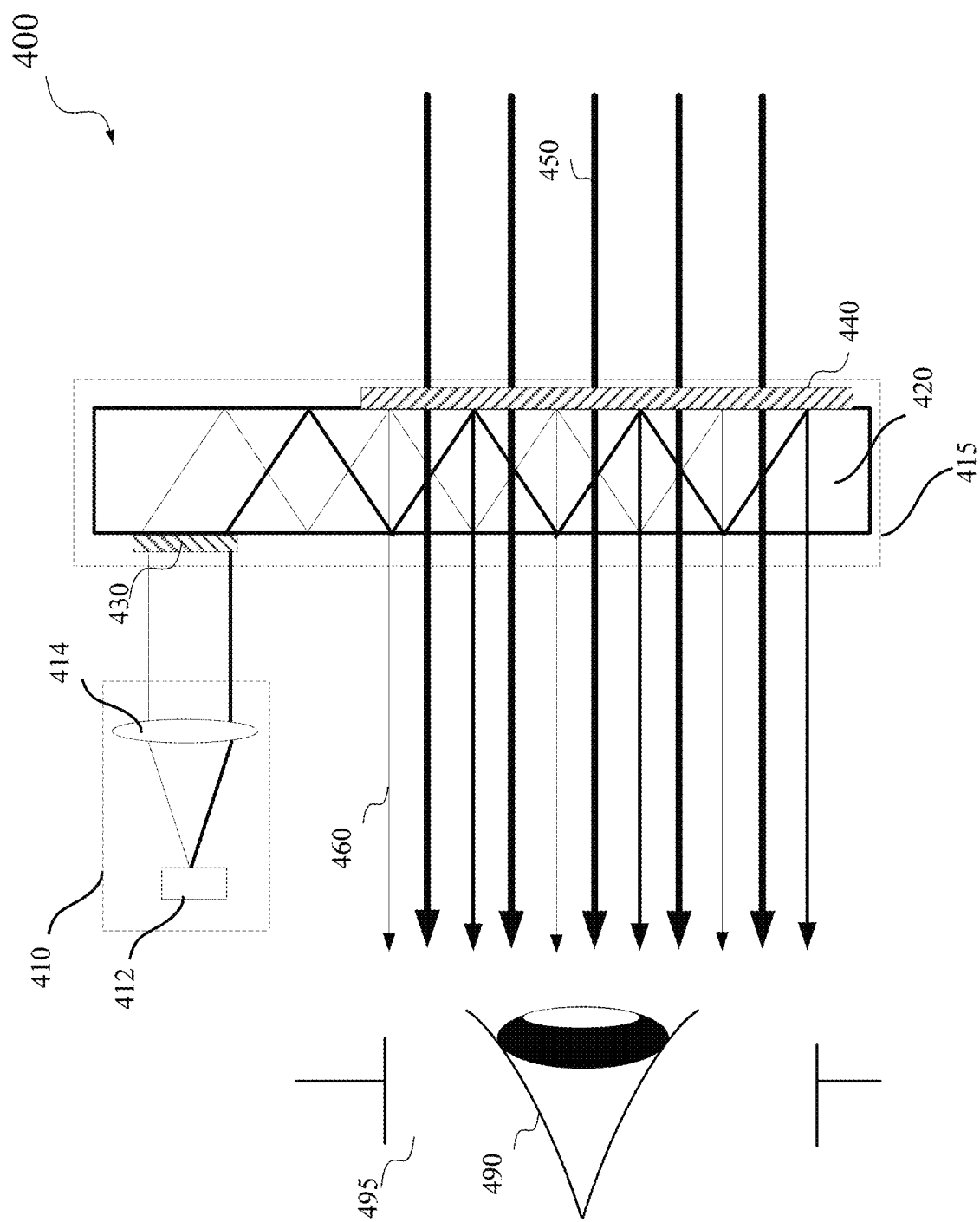
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical-cavity surface-emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements, prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a micro-electro-mechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
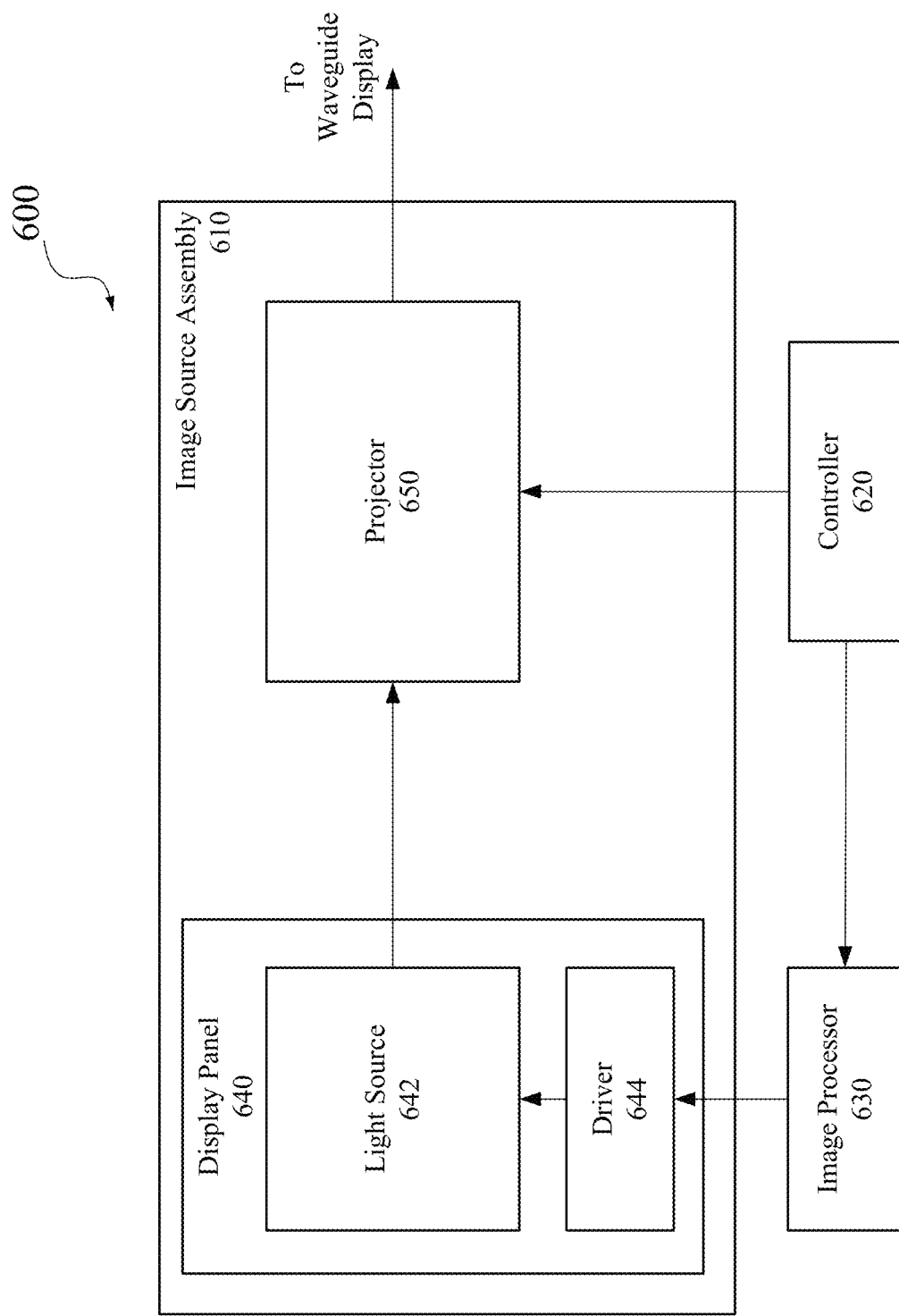
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, or the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red light source, a green light source, and a blue light source, where each light source may include, for example, a laser (e.g., a VCSEL), a micro-LED, a resonant cavity LED (RCLED), or the like. In some embodiments, the light source may include a semiconductor light source, such as a semiconductor laser or a semiconductor LED. A semiconductor LED generally includes an active light-emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

The overall efficiency of a photonic integrated circuit or a waveguide-based display (e.g., in augmented reality system 400 or NED device 500 or 550) may be a product of the efficiency of individual components and may also depend on how the components are connected. For example, the overall efficiency $\eta_{tot}$ of the waveguide-based display in augmented reality system 400 may depend on the light-emitting efficiency of image source 412, the light coupling efficiency from image source 412 into combiner 415 by projector optics 414 and input coupler 430, and the output coupling efficiency of output coupler 440, and thus may be determined as:

$$\eta_{tot} = \eta_{EQE} \times \eta_{in} \times \eta_{out},\qquad(1)$$

where $\eta_{EQE}$ is the external quantum efficiency of image source 412, $\eta_{in}$ is the in-coupling efficiency of light from image source 412 into the waveguide (e.g., substrate 420), and $\eta_{out}$ is the outcoupling efficiency of light from the waveguide towards the user's eye by output coupler 440. Thus, the overall efficiency $\eta_{tot}$ of the waveguide-based display can be improved by improving one or more of $\eta_{EQE}$, $\eta_{in}$, and $\eta_{out}$.

The optical coupler (e.g., input coupler 430 or coupler 532) that couples the emitted light from a light source to a waveguide may include, for example, a grating, a lens, a micro-lens, a prism. In some embodiments, light from a small light source (e.g., a micro-LED) can be directly (e.g., end-to-end) coupled from the light source to a waveguide, without using an optical coupler. In some embodiments, the optical coupler (e.g., a lens or a parabolic-shaped reflector) may be manufactured on the light source.

The visible light sources, image sources, or other displays described herein may include one or more LEDs, one or more organic LEDs (OLEDs), one or more VCSELs, one or more RCLEDs, or the like. It is generally desirable that the visible light sources have small pixel sizes, high brightness, high dynamic ranges, controllable emission directions, individual addressability, large color Gamut coverages, and manufacturing scalability. LEDs and OLEDs may have fundamental limitations in brightness.

A VCSEL generally includes a light-emitting active region in a laser cavity that forms a laser resonator. The light-emitting active region may include quantum wells (QWs) that emit photons when properly biased. The photons may be confined in the laser cavity by a pair of mirrors, such as distributed Bragg reflection (DBR) mirrors or high-contrast grating (HCG) mirrors. In some embodiments, one DBR mirror may be n-doped and the other DBR mirror may be p-doped. In some embodiments, a p-doped layer and an n-doped layer may be used in the laser cavity and the light-emitting active region may be between the p-doped layer and the n-doped layer. VCSELs may be based on a variety of materials. For example, VCSELs with wavelengths from about 650 nm to about 1300 nm may be based on gallium arsenide (GaAs) wafers with DBRs formed by interleaved GaAs and aluminum gallium arsenide (AlGaAs) layers. In GaAs/AlGaAs VCSELs, the lattice constants of the materials do not vary significantly as the composition is changed, thus permitting multiple lattice-matched epitaxial layers to be grown on a GaAs substrate. AlGaAs-based DBRs can have a reflectivity close to 100%, which can efficiently confine photons in the laser cavity. The refractive index of AlGaAs can vary as the Al fraction is increased, thus minimizing the number of layers used to form a DBR mirror with a high reflectivity. AlGaAs-based DBRs doped with p-type or n-type impurities can also serve as current paths. Selectively oxidizing the AlGaAs layers adjacent to the QWs may laterally confine photons and carriers.

Figures 7A, 7B:
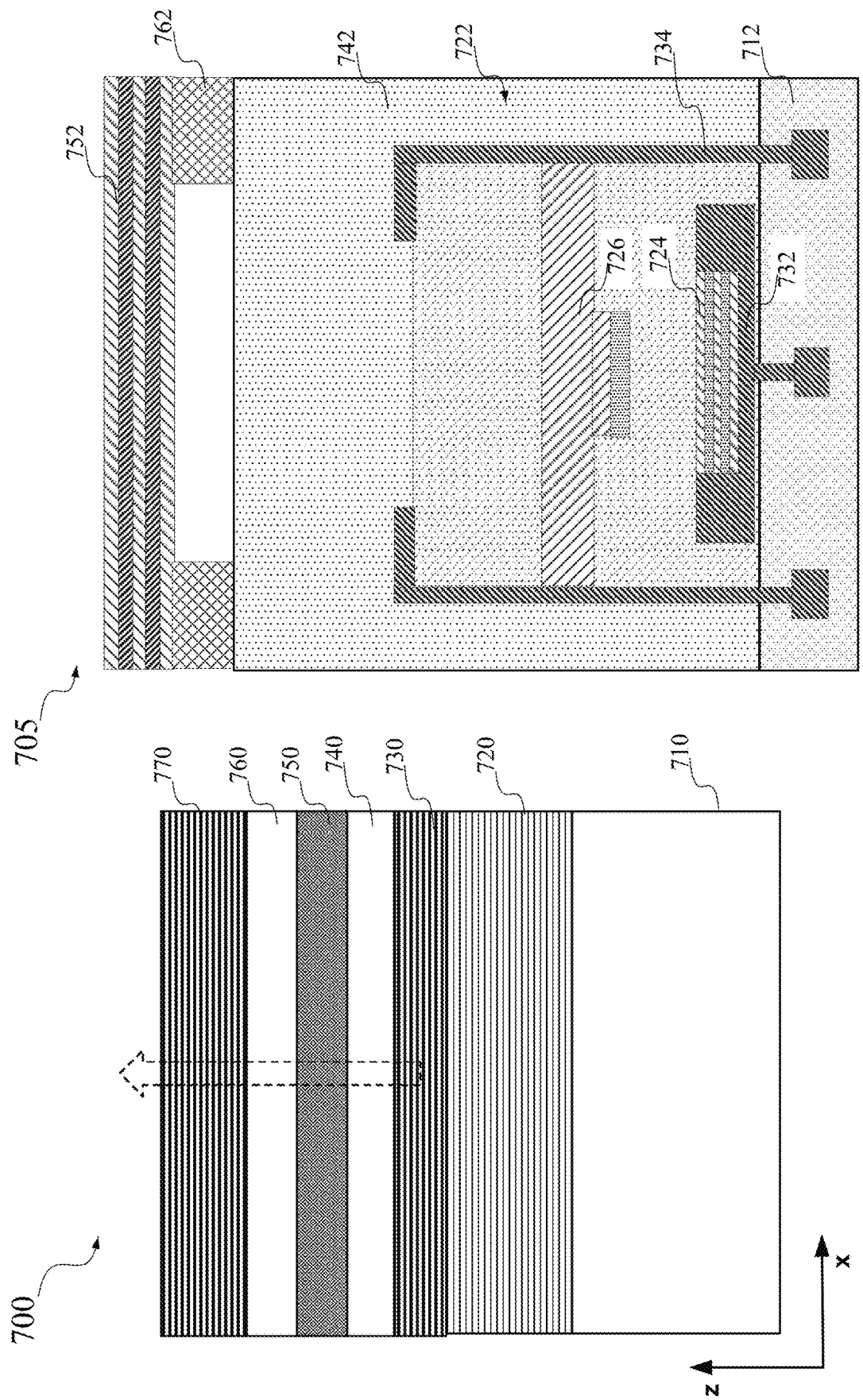
FIG. 7A illustrates an example of a vertical-cavity surface-emitting laser (VCSEL).
FIG. 7B illustrates an example of a tunable VCSEL according to certain embodiments.

FIG. 7A illustrates an example of a VCSEL 700. VCSEL 700 may include a substrate 710, such as a GaAs substrate or a GaN substrate. In the illustrated example, an optional bulk DBR 720 may be formed (e.g., epitaxially grown) on substrate 710. Bulk DBR 720 may include multiple interleaved layers of different materials that have different refractive indices, such as multiple pairs of AlGaAs/GaAs or AlAs/GaAs layers, and thus may reflect light at the interfaces between the different material layers to achieve a high overall reflectivity. A bottom DBR 730 may be formed on bulk DBR 720 or may be part of bulk DBR 720. Bottom DBR 730 may similarly include multiple interleaved layers of different materials with different refractive indices. VCSEL 700 may also include a cladding layer 740, an active region 750, and a cladding layer 760, where cladding layers 740 and 760 may be p-doped or n-doped and may inject carriers into active region 750. Active region 750 may include one or more quantum wells or quantum dots, and QW barrier layers. Carriers may recombine in active region 750 to emit photons. A top DBR 770 may be formed on cladding layer 760, and may be similar to bottom DBR 730. Top DBR 770 and bottom DBR 730 (and bulk DBR 720) may form a plane-parallel laser cavity that can confine photons. Top DBR 770, cladding layer 760, active region 750, cladding layer 740, and bottom DBR 730 may be vertically etched to form individual VCSELs of a desired size with a desired pitch on bulk DBR 720 and substrate 710.

VCSEL 700 may have a linear dimension less than about 100 μm, 50 μm, 30 μm, 20 μm, or 10 μm. For example, in some embodiments, the parallel laser cavity may have a length about 10 μm. In the example shown in FIG. 7A, bottom DBR 730 and bulk DBR 720, in combination, may have a reflectivity close to 100% to reflect almost all incident photons. Top DBR 770 may have a reflectivity less than 100%, such that a portion of the emitted photons may be transmitted out of the laser cavity through top DBR 770. VCSEL 700 may emit infrared light with a high efficiency and a high power, such as from about 1 mW to about 10 mW or higher.

FIG. 7B illustrates an example of a tunable VCSEL 705 according to certain embodiments. The vertical cavity in tunable VCSEL 705 may be formed by a first reflector 724 and a second reflector 752, where first reflector 724 and second reflector 752 may have a high reflectivity (e.g., >80%, >85%, >90%, >95%, >99%, or higher) for IR light, and second reflector 752 may have a low reflectivity or may be anti-reflective for visible light.

Tunable VCSEL 705 may include a drive circuit 712 that may be bonded directly or indirectly (e.g., through an interposer or a thin-film transistor layer) to a VCSEL 722 by, for example, die-to-wafer bonding or wafer-to-wafer bonding. Drive circuit 712 may include various circuits formed on a silicon substrate as described above, for example, with respect to FIG. 6. Drive circuit 712 may be bonded to the electrodes of VCSEL 722 to drive VCSEL 722 to generated continuous-wave (CW) or pulsed IR light having a sufficiently long duration. The intensity of the IR light emitted by VCSEL 722 and thus the intensity of the visible light from tunable VCSEL 705 may be controlled by the drive current or voltage supplied to VCSEL 722 by drive circuit 712.

VCSEL 722 may include a first electrode 732 (e.g., anode or cathode), a second electrode 734, and a semiconductor structure (e.g., epitaxial layers) formed between first electrode 732 and second electrode 734. The semiconductor structure may include, for example, first reflector 724, an active region 726 that may emit IR light, and other semiconductor layers (not labeled in FIG. 7B), such as cladding layers or carrier injection layers that may be p-doped or n-doped, as described above with respect to FIG. 7.

First reflector 724 and second reflector 752 may each include a DBR reflector formed by multiple pairs of dielectric, semiconductor, or metallic material layers (doped or undoped) having different refractive indices and/or thicknesses, such as GaAs and AlAs (or AlGaAs) layers, oxide layers (e.g., silicon oxide and another oxide layer), or the like. In some embodiments, at least one of first reflector 724 or second reflector 752 may include a high-contrast grating (HCG) that may include a layer of subwavelength grating made of materials with a large refractive index contrast. The HCG may have a broad bandwidth of high reflectivity and may be used tunable mirror. Active region 726 may include, for example, InGaAs quantum well layers and GaAs barrier layers, InAlGaAs quantum well layers and AlGaAs barrier layers, or the like.

In the illustrated example, tunable VCSEL 705 includes a micro-electro-mechanical-system (MEMS) device 762 in the tunable vertical cavity formed by first reflector 724 and second reflector 752, where second reflector 752 may be formed on MEMS device 762 and thus may be movable by MEMS device 762. In some embodiments, other microactuators or nano-actuators, such as a micro-motor, a piezoelectric actuator, a ferroelectric actuator, a magnetic actuator, an ultrasonic actuator, or the like, may be used to move second reflector 752. Light emitted by VCSEL 722 and oscillating within the vertical cavity formed by first reflector 724 and second reflector 752 may be continuously tunable by tuning the location of second reflector 752 using MEMS device 762 or another actuator to tune the optical path length and thus the resonant wavelength of the vertical cavity.

As described above, the spectral coverage of lasers based on III-V semiconductors (e.g., InGaN or AlGaAs) may be limited by properties (e.g., bandgaps) of available gain media. It can be very difficult to make VCSELs for some colors (e.g., green) and having high efficiencies. It may be even more challenging to manufacture visible light laser sources for multiple colors on a same chip or wafer. Furthermore, current visible light sources may typically have large sizes and thus may not be suitable for individually addressable high-density visible light source array. Integration of III-V semiconductor devices with photonic integrated circuits (PICs) may pose additional challenges to the manufacturing.

According to certain embodiments, nonlinear effects of certain nonlinear gain media may be used to generate visible light in a wide spectral range using IR pump light from VCSELs. In one example, a visible semiconductor light source may include a VCSEL that may emit light in the near-infrared (NIR) or other infrared (IR) band with a high efficiency. The visible semiconductor light source may also include a micro-resonator including a third-order nonlinear material and thus may convert the IR light into visible light using degenerate four-wave mixing (also referred to as third-order optical parametric oscillation (OPO)) caused by the nonlinear optical effect (e.g., third-order nonlinear effect $\chi^{(3)}$) of the micro-resonator.

Four-wave mixing is a nonlinear effect arising from a third-order optic nonlinearity (Kerr effect) described by a $\chi^{(3)}$ coefficient. Four-wave mixing can occur when light having two frequency components $v_1$ and $v_2$ propagate together in an optical waveguide including a third-order nonlinear medium. A refractive index modulation due to the third-order nonlinear effect may cause the generation of light having two additional frequency components $v_3$ and $v_4$, where $v_4=v_1+v_2-v_3$ and the light having frequencies v3 and v4 may experience parametric amplification in the nonlinear medium. This process may be referred to as non-degenerate four-wave mixing. When the two frequency components $v_1$ and $v_2$ of the four frequencies coincide, degenerate four-wave mixing (DFWM) may occur, where a single-frequency pump wave (e.g., having a frequency $v_p$) may cause the generation and amplification of a signal wave (having a frequency $v_s$) and an idler wave (having a frequency $v_i$), and where a frequency phase-matching condition $2v_p=v_s+v_i$ may be met. The signal wave and the idler wave may generally have different frequencies.

FIGS. 8A and 8B illustrate an example of generating a higher frequency light signal using lower frequency pump light through degenerate four-wave mixing. Two pump photons 810 having a frequency $v_p$ may be summed to generate a virtual excited state 815, which may be used to generate a pair of photons 820 and 830 with frequencies $v_s$ and $v_i$, respectively. Due to energy conservation, frequencies $v_s$ and $v_i$ of photons 820 and 830 may be symmetrical with respect to frequency $v_p$ of pump photons 810 (i.e., $|v_s-v_p|=|v_p-v_i|$) as show in FIG. 8B.

Four-wave mixing is a phase-sensitive process. Its effect may accumulate over a longer distance (e.g., through many loops in a ring resonator) if a phase-matching condition for constructive interference is satisfied (which may be influenced by chromatic dispersion and/or nonlinear phase shifts). A ring resonator may include a closed-loop waveguide coupled to an input coupler and/or an output coupler. When light at a resonant wavelength of the ring resonator propagates through the closed-loop waveguide, its intensity builds up over multiple round-trips due to the constructive interference between loops. Only light of a few wavelengths may resonate within the closed-loop waveguide. The optical path length of a ring resonator may be $2\pi r \times n_{eff}$, where r is the radius of the ring resonator and $n_{eff}$ is the effective refractive index of the ring resonator. To meet the resonant condition for constructive interference, the optical path length of the ring (loop) may be an integer multiple of the wavelength of the resonant light: $m \times \lambda_m = 2\pi r \times n_{eff}$, where $\lambda_m$ is the resonant wavelength and m is the mode number (a positive integer) of the ring resonator. The resonant frequency or wavelength may be tuned by changing the effective refractive index $n_{eff}$ of the ring resonator and/or by changing the wavelength of the pump light.

FIG. 8C illustrates multiple longitudinal resonant modes of an example of a micro-resonator (e.g., a ring resonator). FIG. 8C shows three longitudinal resonant modes m−1, m, and m+1. The full-width half-magnitude (FWHM) of the transmission spectra of a longitudinal mode is $\delta v$. The difference between the frequencies of two adjacent modes is the free spectral range $v_{fsr}$. The quality factor Q and the finesse F of the micro-resonator can be described by:

$$Q = \frac{\lambda}{\delta v}, \text{ and}$$

$$F = \frac{v_{fsr}}{\delta v},$$

where $\lambda$ is the operation wavelength. The quality factor can be used to determine the spectral range of the resonance condition for a given ring resonator, and is also useful for quantifying the amount of round-trip loss in the resonator. A low Q factor may be caused by large loss. The finesse F may also relate to the resonator loss, and thus may indicate the round-trip resonator loss.

OPO is an optical parametric amplification (OPA) within an optical resonator (e.g., resonant optical cavity). For example, in a ring resonator, OPO is a cavity-enhanced DFWM, where all three light waves (pump wave, signal wave, and idler wave) meet the resonance condition of the same cavity and therefore can resonate in the ring resonator to greatly enhance the nonlinear conversion through resonance-enhanced field strength build-up. Therefore, the frequency of the pump wave may be limited to a set of longitudinal resonant modes determined by the optical path length of the ring resonator at the pump wavelength. Similarly, the frequency of the signal wave may be limited to a set of longitudinal resonant modes determined by the optical path length of the ring resonator at the signal wavelength, and the frequency of the idler wave may be limited to a set of longitudinal resonant modes determined by the optical path length of the ring resonator at the idler wavelength. Using a low-loss optical resonator (e.g., a ring resonator), the nonlinear conversion efficiency can be significantly boosted (>10%) within a resonator having a compact footprint (e.g., with a radius <10 µm for some high refractive index materials such as SiC). Since the wavelength (color) of the generated signal wave can be controlled by the optical path length of the cavity to meet the resonance condition, the resonant optical cavity (e.g., ring resonator) may be designed to generate light of any color in the visible range.

According to certain embodiments, the pump light for the DFWM in a resonant optical cavity (e.g., a micro-resonator) may be IR light generated by a VCSEL, where the micro-resonator may be positioned inside or outside the VCSEL cavity in either an intra-cavity configuration or an extra-cavity configuration, respectively. The IR light emitted by the VCSEL may be coupled into the micro-resonator directly or by a coupling structure (e.g., a grating coupler). In some embodiments, the IR light emitted by the VCSEL may be coupled into a waveguide by a coupling structure (e.g., a grating coupler or nano-resonators) inside or outside the VCSEL cavity and may then be coupled from the waveguide into the micro-resonator. In some embodiments, the grating coupler may include an apodized, chirped, and/or slanted grating to achieve the desired coupling direction and the desired coupling efficiency. In some embodiments, a visible light source may include multiple coupling structures in either the extra-cavity or the intra-cavity configuration.

The micro-resonator may include a low-loss structure in which light may travel for a long time before being absorbed, scattered, or converted. As described above, the color of the light generated through the OPO process can be controlled by the geometry and material (and thus the effective refractive index) of the micro-resonator. According to certain embodiments, the micro-resonator may include, for example, a micro-ring resonator as described above, a photonic crystal point defect cavity, a photonic crystal ring (line-defect) cavity, a plasmonic resonator, a waveguide grating-based resonator, or the like. For example, when a point defect is created in a photonic crystal, the defect may pull a light mode into the band gap and trap the light mode (forming a resonant cavity) because such a state is forbidden from propagating in the bulk crystal, and the density of the states at the resonant frequency can be very high in the resonant cavity to achieve a high efficiency. A photonic crystal line-defect cavity may be formed by, for example, omitting multiples holes in a photonic crystal slab.

According to certain embodiments, the visible light generated by the degenerate four-wave mixing in the resonant cavity of the micro-resonator may be coupled out of the micro-resonator into a waveguide of a PIC through side coupling, or may be coupled out of the micro-resonator into free space through vertical coupling by a coupling structure, such as a grating coupler. In some embodiments, the grating coupler may include an apodized, chirped, and/or slanted grating to achieve the desired coupling direction and high coupling efficiency.

Figure 9A:
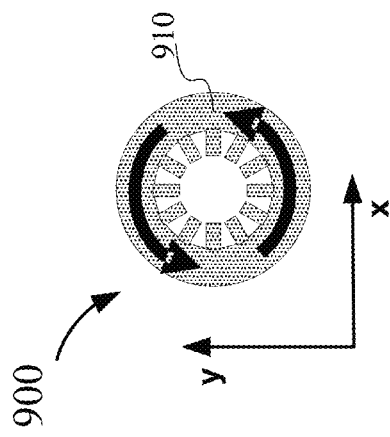
FIG. 9A shows a cross-sectional view of an example of a coupling structure configured to vertically couple light generated in an optical resonator out of the optical resonator according to certain embodiments.
Figure 9B:
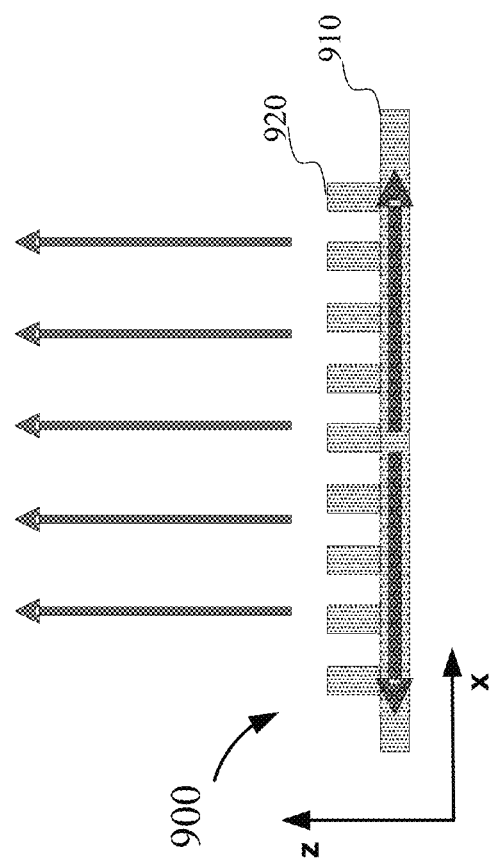
FIG. 9B shows a top view of the example of the coupling structure of FIG. 9A according to certain embodiments.

FIG. 9A shows a cross-sectional view of an example of a structure 900 including a coupling structure 920 configured to vertically couple light generated in an optical resonator 910 out of optical resonator 910 according to certain embodiments. FIG. 9B shows a top view of the example of structure 900 of FIG. 9A according to certain embodiments. In the illustrated example, optical resonator 910 may include a micro-ring resonator. In some embodiments, optical resonator 910 may have a shape different from a ring shape, such as an oval shape, a racetrack shape, a spiral shape (e.g., an Archimedean spiral shape), or another closed loop. Optical resonator 910 may include a low-loss material having a third-order nonlinearity. In some embodiments, to reduce the footprint of optical resonator 910, optical resonator 910 may include a high refractive index material, such as SiN or SiC. Coupling structure 920 may include a grating coupler formed on optical resonator 910, where the grating coupler may be along an inner circumference of optical resonator 910, on top or bottom of optical resonator 910, along an outer circumference of optical resonator 910, or any combination of the aforementioned positions. The grating coupler may include a slanted grating having a grating vector that includes a component in the z direction, such that light propagating in a ring in an x-y plane in optical resonator 910 may be vertically coupled out of optical resonator 910 by the grating coupler.

Figure 9C:
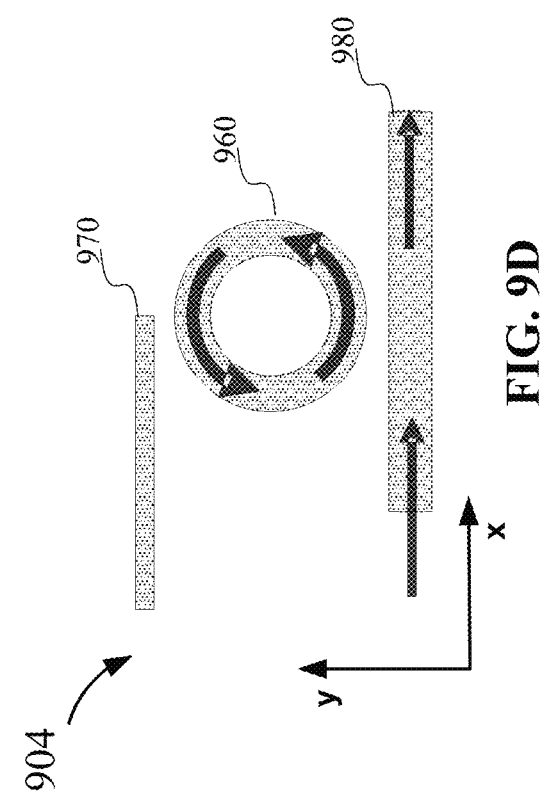
FIG. 9C illustrates a top view of an example of a structure configured to couple light generated in an optical resonator into an output waveguide according to certain embodiments.

FIG. 9C illustrates a top view of an example of a structure 902 configured to couple light generated in an optical resonator 930 into an output waveguide 950 according to certain embodiments. In the example shown in FIG. 9C, IR pump light from a VCSEL may be coupled from a pump waveguide 940 into optical resonator 930, and the generated visible light (e.g., the signal wave) may be coupled into output waveguide 950. The idler wave may be coupled into pump waveguide 940 or output waveguide 950. In some embodiments, a wavelength-division demultiplexer may be used to separate the signal wave and the idler wave.

Figure 9D:
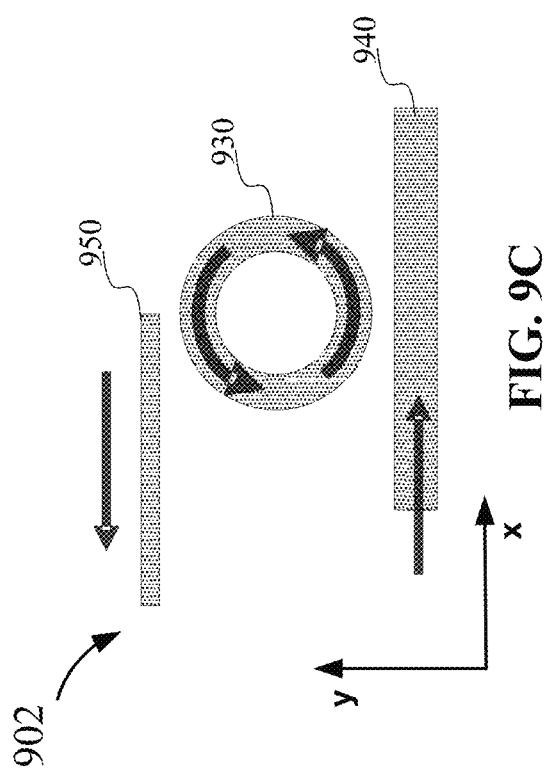
FIG. 9D illustrates a top view of another example of a structure configured to couple light generated in an optical resonator into an output waveguide according to certain embodiments.

FIG. 9D illustrates a top view of an example of a structure 904 configured to couple light generated in an optical resonator into a waveguide 980 according to certain embodiments. In the illustrated example, IR pump light from a VCSEL may be at least partially coupled from waveguide 980 into optical resonator 960, and the generated visible light (e.g., the signal wave) may be coupled back into waveguide 980. The idler wave may be coupled into waveguide 980 or another waveguide 970. In some embodiments, a wavelength-division demultiplexer may be used to separate the signal wave and the uncoupled pump wave in waveguide 980. In some embodiments, the uncoupled pump wave may be looped back into waveguide 980 and coupled into optical resonator 960.

Figure 10B:
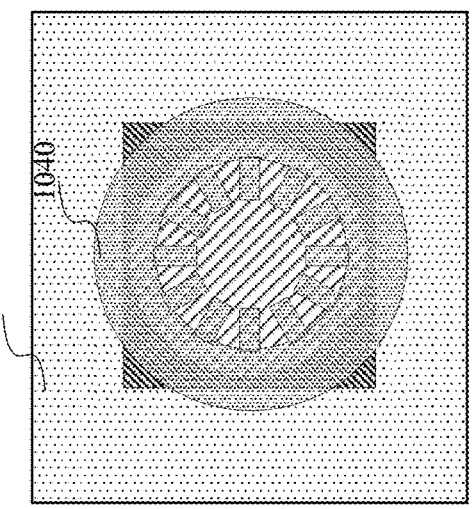
FIGS. 10A and 10B illustrate an example of a visible light source including a micro-resonator in a vertical cavity and directly pumped by an infrared light VCSEL in the vertical cavity according to certain embodiments, where visible light generated in the micro-resonator is vertically coupled out of the vertical cavity.
Figure 10A:
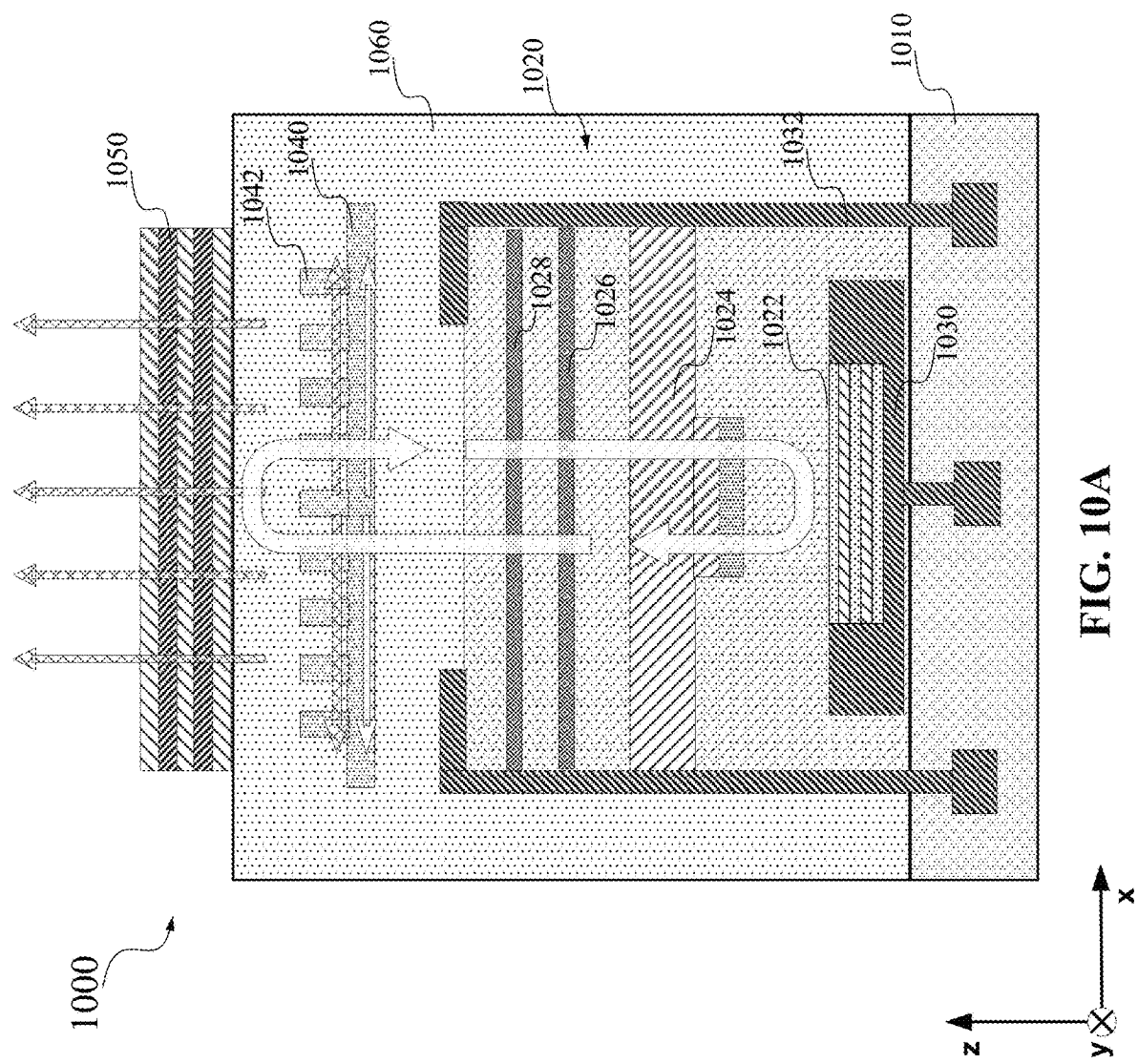

FIG. 10A illustrates an example of a visible light source 1000 including a micro-resonator 1040 in a vertical cavity and directly pumped by an infrared light VCSEL 1020 in the vertical cavity according to certain embodiments, where visible light generated in micro-resonator 1040 is vertically coupled out of the vertical cavity. FIG. 10B illustrates a top view of the example of visible light source 1000 of FIG. 10A. The vertical cavity in visible light source 1000 may be formed by a first reflector 1022 and a second reflector 1050, where first reflector 1022 and second reflector 1050 may have a high reflectivity (e.g., >805, >85%, >90%, >95%, >99%, or higher) for IR light, and second reflector 1050 may have a low reflectivity or may be anti-reflective for visible light.

Visible light source 1000 may include a drive circuit 1010 that may be bonded directly or indirectly (e.g., through an interposer or a thin-film transistor layer) to VCSEL 1020 by, for example, die-to-wafer bonding or wafer-to-wafer bonding. Drive circuit 1010 may include various circuits formed on a silicon substrate as described above, for example, with respect to FIG. 6. Drive circuit 1010 may be bonded to the electrodes of VCSEL 1020 to drive VCSEL 1020 to generated continuous-wave (CW) or pulsed IR light having a sufficiently long duration. The intensity of the IR light emitted by VCSEL 1020 and thus the intensity of the visible light from visible light source 1000 may be controlled by the drive current or voltage supplied to VCSEL 1020 by drive circuit 1010.

VCSEL 1020 may include a first electrode 1030 (e.g., anode or cathode), a second electrode 1032, and a semiconductor structure (e.g., epitaxial layers) formed between first electrode 1030 and second electrode 1032. The semiconductor structure may include, for example, first reflector 1022, an active region 1024 that may emit IR light, and other semiconductor layers (not labeled in FIG. 10A), such as cladding layers or carrier injection layers that may be p-doped or n-doped, as described above with respect to FIG. 7. First reflector 1022 may include, for example, a high-contrast grating (HCG) as described with respect to FIG. 7, or a DBR reflector formed by multiple pairs of dielectric, semiconductor, or metallic material layers (doped or undoped) having different refractive indices and/or thicknesses, such as GaAs and AlAs (or AlGaAs) layers, oxide layers (e.g., silicon oxide and another oxide layer), or the like. Active region 1024 may include, for example, InGaAs quantum well layers and GaAs barrier layers, InAlGaAs quantum well layers and AlGaAs barrier layers, or the like.

In some embodiments, VCSEL 1020 may include a partial reflector 1026 for IR light, where the partial reflector may partially reflect and partially transmit IR light emitted in active region 1024 to form a resonant cavity for VCSEL 1020 with first reflector 1022. The resonant cavity formed by partial reflector 1026 and first reflector 1022 may help to narrow and select the output wavelength range of the IR light and improve the gain and the intensity of the emitted IR light. In some embodiments, VCSEL 1020 may include a polarizer 1028. Polarizer 1028 may be used to control the polarization state of IR light emitted by VCSEL 1020 and improve the coupling efficiency of the IR light into micro-resonator 1040 by, for example, a grating coupler or nano-resonators (e.g., meta-structures), which may be polarization dependent. In some embodiments, other polarization components, such as a waveplate, a spatially-variant polarizer, or a spatially-variant waveplate, may be used instead to control the polarization state of IR light emitted by VCSEL 1020.

The IR light emitted by VCSEL 1020 may be coupled into micro-resonator 1040 directly or through a coupling structure, such as a slanted grating or nano-resonators. As described above, micro-resonator 1040 may include a closed-looped waveguide having any suitable shape (e.g., a ring, oval, spiral, or racetrack shape) and having a low loss such that a photon may propagate in the closed-looped waveguide for a long period of time (e.g., about a thousand or more loops) before being absorbed, scattered, or converted. The waveguide material may have a third-order nonlinearity such that the OPO (e.g., DFWM) process may occur in the closed-looped waveguide. The material and geometry of micro-resonator 1040 may be selected such that the IR light coupled into micro-resonator 1040, and the visible light (signal wave) and idler wave generated by the DFWM process may resonate in micro-resonator 1040, which may enhance the DFWM process. In some embodiments, micro-resonator 1040 may include a material that has a high refractive index, such that the physical dimension of micro-resonator 1040 may be reduced while achieving the desired optical path length of the closed-looped waveguide. VCSEL 1020 and micro-resonator 1040 may be surrounded by dielectric materials 1060, which may include, for example, an oxide such as silicon dioxide or a polymer material. In some embodiments, visible light source 1000 may include two or more micro-resonators arranged vertically and configured to generate visible light of the same color.

Visible light generated in micro-resonator 1040 by the DFWM process may be vertically coupled out of micro-resonator 1040 by a coupling structure 1042, which may include a grating or nano-resonators as described above, for example, with respect to FIGS. 9A and 9B. The visible light coupled out of micro-resonator 1040 may be transmitted by second reflector 1050 with little or no loss since second reflector 1050 may be anti-reflective for visible light as described above. As first reflector 1022, second reflector 1050 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1050 for IR light, while visible light reflected at adjacent interfaces between different materials may destructively interfere to reduce the overall reflectivity of second reflector 1050 for visible light. As such, IR light emitted by VCSEL 1020 and not coupled into micro-resonator 1040 may be reflected back to micro-resonator 1040 by second reflector 1050 and/or first reflector 1022, and may be at least partially coupled into micro-resonator 1040 to improve the efficiency of coupling the IR light into micro-resonator 1040 and thus the efficiency of visible light source 1000. Micro-resonator 1040, coupling structure 1042, and second reflector 1050 may be formed before or after bonding VCSEL 1020 to drive circuit 1010.

Figure 11B:
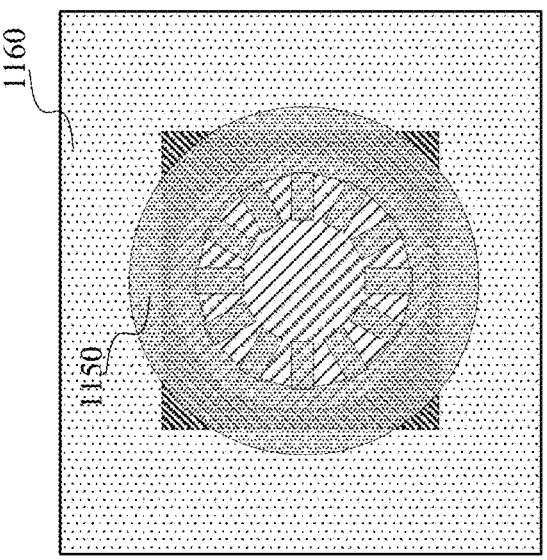
FIG. 11B illustrates a top view of the example of visible light source of FIG. 11A.
Figure 11A:
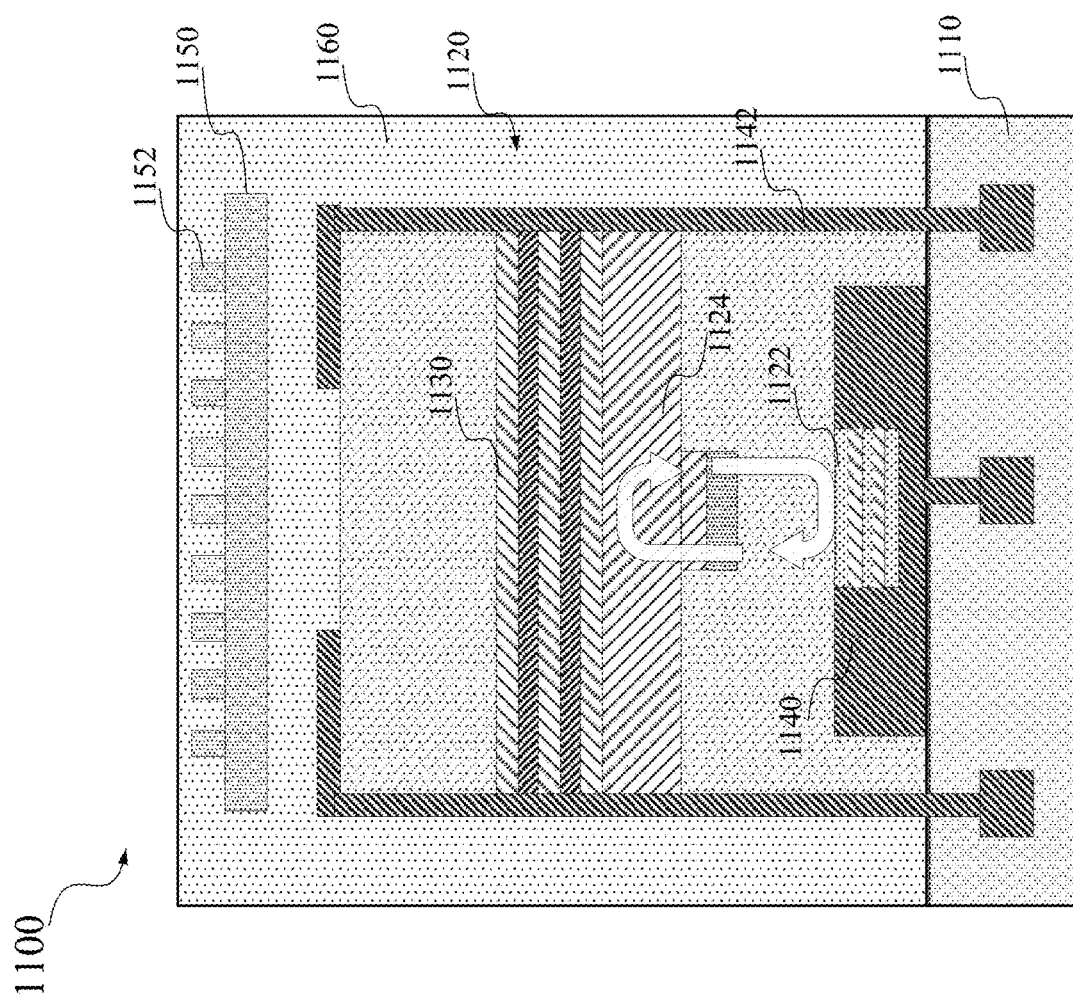
FIG. 11A illustrates an example of a visible light source including a micro-resonator outside of a vertical cavity and directly pumped by an infrared light VCSEL according to certain embodiments.

FIG. 11A illustrates an example of a visible light source 1100 including a micro-resonator 1150 outside of a vertical cavity and directly pumped by an infrared light VCSEL 1120 according to certain embodiments. FIG. 11B illustrates a top view of the example of visible light source 1100 of FIG. 11A. Visible light source 1100 may include a drive circuit 1110 that may be bonded directly or indirectly (e.g., through an interposer or a thin-film transistor layer) to VCSEL 1120 by, for example, die-to-wafer bonding or wafer-to-wafer bonding. Drive circuit 1110 may include various circuits formed on a silicon substrate as described above, for example, with respect to FIG. 6. Drive circuit 1110 may be bonded to the electrodes of VCSEL 1120 to drive VCSEL 1120 to generated continuous-wave (CW) or pulsed IR light having a sufficiently long duration and a desired intensity. The intensity of the IR light emitted by VCSEL 1120 and thus the intensity of the visible light from visible light source 1100 may be controlled by the drive current or voltage supplied to VCSEL 1120 by drive circuit 1110.

VCSEL 1120 may include a first electrode 1140 (e.g., anode or cathode), a second electrode 1142, and a semiconductor structure (e.g., epitaxial layers) formed between first electrode 1140 and second electrode 1142. The semiconductor structure may include, for example, a first reflector 1122, an active region 1124 that may emit IR light, and other semiconductor layers (not labeled in FIG. 11A), such as cladding layers or carrier injection layers that may be p-doped or n-doped, as described above with respect to FIG. 7. First reflector 1122 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. First reflector 1122 may have a high reflectivity (e.g., >80%, >85%, >90%, >95%, >99%, or higher) for IR light. Active region 1124 may include, for example, InGaAs quantum well layers and GaAs barrier layers, InAlGaAs quantum well layers and AlGaAs barrier layers, or the like. VCSEL 1120 may also include a second reflector 1130 that may be a partial reflector configured to reflect a portion of the IR light emitted by active region 1124 while transmitting a portion of the IR light emitted by active region 1124.

Second reflector 1130 may include, for example, an HCG, or a DBR structure formed by conductive materials, such as GaAs and AlAs (or AlGaAs). First reflector 1122 and second reflector 1130 may form the vertical cavity in visible light source 1100. The vertical cavity may help to narrow and select the output wavelength range of the IR light and improve the gain and the intensity of the emitted IR light. In some embodiments, VCSEL 1120 may include a polarizer (not shown in FIG. 11A) as described above with respect to FIG. 10A. The polarizer may be used to control the polarization mode of IR light emitted by VCSEL 1120 and improve the coupling efficiency of the IR light into micro-resonator 1150 by, for example, a grating coupler or nano-resonators (e.g., meta-structures), which may be polarization dependent.

The IR light emitted by VCSEL 1120 may be coupled into micro-resonator 1150 directly or through a coupling structure, such as a slanted grating or nano-resonators. As described above, micro-resonator 1150 may include a closed-looped waveguide having any suitable shape (e.g., a ring, oval, spiral, racetrack shape) and having a low loss such that a photon may propagate in the closed-looped waveguide for a long period of time (e.g., about a thousand or more loops) before being absorbed, scattered, or converted. The waveguide material may have a third-order nonlinearity such that the OPO (e.g., DFWM) process may occur in the closed-looped waveguide. The size and material of micro-resonator 1150 may be selected such that the IR light coupled into micro-resonator 1150, and the visible light (signal wave) and idler wave generated by the DFWM process may resonate in micro-resonator 1150, which may enhance the DFWM process. In some embodiments, micro-resonator 1150 may include a material that has a high refractive index (e.g., SiN, SiC, etc.), such that the physical dimension of micro-resonator 1150 may be reduced while achieving the desired optical path length of the closed-looped waveguide. VCSEL 1120 and micro-resonator 1150 may be surrounded by dielectric materials 1160, which may include, for example, an oxide such as silicon dioxide.

Visible light generated in micro-resonator 1150 by the DFWM process may be vertically coupled out of micro-resonator 1150 by a coupling structure 1152, which may include a grating or nano-resonators as described above, for example, with respect to FIGS. 9A and 9B. The visible light coupled out of micro-resonator 1150 may be vertically coupled out of visible light source 1100. Micro-resonator 1150 and coupling structure 1152 may be formed before or after bonding VCSEL 1120 to drive circuit 1110. In some embodiments, the visible light generated in micro-resonator 1150 may be coupled to a waveguide as described with respect to FIGS. 9C and 9D.

In some embodiments, a feedback cavity structure (a DBR structure or a hot mirror that reflects IR light and transmits visible light) may be formed on top of micro-resonator 1150 and coupling structure 1152 to redirect IR light that is not coupled into micro-resonator 1150 yet back to micro-resonator 1150 to improve the efficiency of coupling the IR pump light into micro-resonator 1150 and the efficiency of visible light source 1100.

Figure 12A:
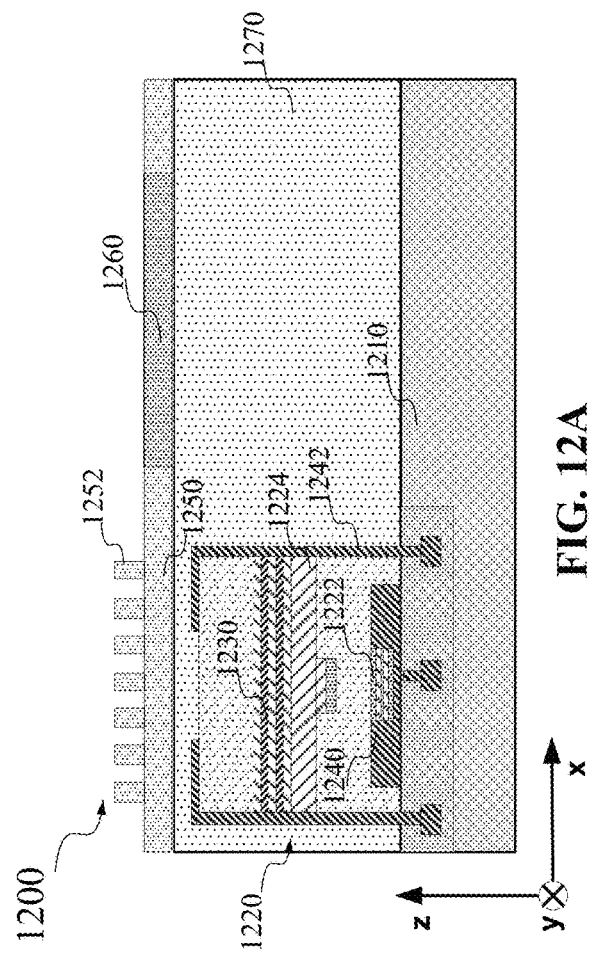
FIGS. 12A and 12B illustrate an example of a visible light source including a micro-resonator pumped by an infrared light VCSEL according to certain embodiments, where the infrared light is coupled into the micro-resonator through an input coupling structure and a waveguide on a same layer as the micro-resonator.
Figure 12B:
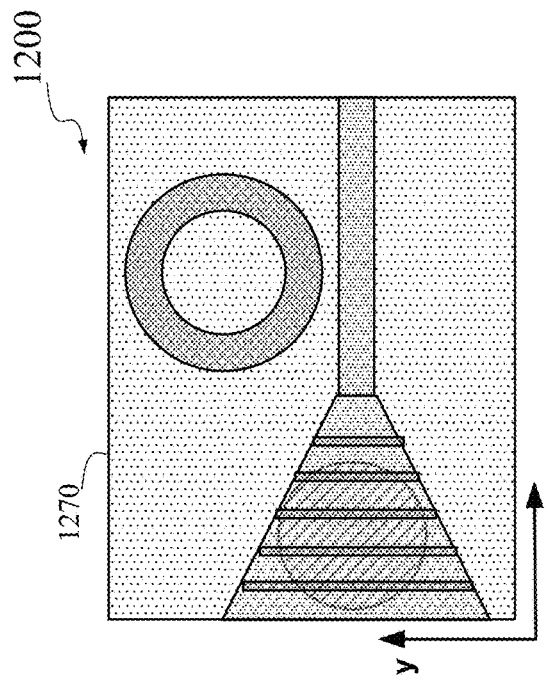

FIG. 12A illustrates an example of a visible light source 1200 including a micro-resonator 1260 pumped by an infrared light VCSEL 1220 according to certain embodiments, where the infrared light is coupled into the micro-resonator through an input coupling structure and a waveguide on a same layer as micro-resonator 1260. FIG. 12B illustrates a top view of the example of visible light source 1200 of FIG. 12A. Visible light source 1200 may include a drive circuit 1210 that may be bonded directly or indirectly (e.g., through an interposer or a thin-film transistor layer) to VCSEL 1220 by, for example, die-to-wafer or wafer-to-wafer bonding. Drive circuit 1210 may include various circuits formed on a silicon substrate as described above, for example, with respect to FIG. 6. Drive circuit 1210 may be bonded to the electrodes of VCSEL 1220 to drive VCSEL 1220 to generated continuous-wave (CW) or pulsed IR light having a sufficiently long duration and a desired intensity. The intensity of the IR light emitted by VCSEL 1220 and thus the intensity of the visible light from visible light source 1200 may be controlled by the drive current or voltage supplied to VCSEL 1220 by drive circuit 1210.

VCSEL 1220 may be similar to VCSEL 1120 and may include a first electrode 1240 (e.g., anode or cathode), a second electrode 1242, and a semiconductor structure (e.g., epitaxial layers) formed between first electrode 1240 and second electrode 1242. The semiconductor structure may include, for example, a first reflector 1222, an active region 1224 that may emit IR light, and other semiconductor layers (not labeled in FIG. 12A), such as cladding layers or carrier injection layers that may be p-doped or n-doped, as described above with respect to FIG. 7. First reflector 1222 may include, for example, an HCG, or a DBR reflector formed by multiple pairs of dielectric or doped or undoped semiconductor materials of different refractive indices and thicknesses, such as GaAs and AlAs (or AlGaAs) layers, oxide layers (e.g., silicon oxide and another oxide layer), or the like. First reflector 1222 may have a high reflectivity (e.g., >80, >85%, >90%, >95%, >99%, or higher) for IR light. Active region 1224 may include, for example, InGaAs quantum well layers and GaAs barrier layers, InAlGaAs quantum well layers and AlGaAs barrier layers, or the like. VCSEL 1220 may also include a second reflector 1230 that may be a partial reflector configured to reflect a portion of the IR light emitted by active region 1224 while transmitting a portion of the IR light emitted by active region 1224. Second reflector 1230 may include, for example, an HCG, or a DBR structure formed by conductive materials, such as doped or undoped GaAs and AlAs (or AlGaAs). First reflector 1222 and second reflector 1230 may form the vertical cavity in visible light source 1200. The vertical cavity may help to select the output wavelength range of the IR light and improve the gain and the intensity of the emitted IR light. In some embodiments, VCSEL 1220 may include a polarization element (e.g., a polarizer, a waveplate, a spatially-variant polarizer, or a spatially-variant waveplate, which is not shown in FIG. 12A) as described above with respect to FIG. 10A. The polarizer may be used to control the polarization mode of IR light emitted by VCSEL 1220 and improve the coupling efficiency of the IR light into micro-resonator 1260 by, for example, a grating coupler or nano-resonators (e.g., meta-structures), which may be polarization dependent.

The IR light emitted by VCSEL 1220 may be coupled into a waveguide 1250 directly or through a coupling structure 1252 (which may be above or below waveguide 1250), such as a slanted grating or nano-resonators. The IR light propagating in waveguide 1250 may be coupled into micro-resonator 1260. In the illustrated example, waveguide 1250 and micro-resonator 1260 may be on a same waveguide material layer (e.g., a SiN or SiC layer). As described above, micro-resonator 1260 may include a closed-looped waveguide having any suitable shape (e.g., a ring, oval, spiral, racetrack shape) and having a low loss such that a photon may propagate in the closed-looped waveguide for a long period of time (e.g., about one thousand or more loops) before being absorbed, scattered, or converted. The waveguide material may have a third-order nonlinearity such that the OPO (e.g., DFWM) process may occur in the closed-looped waveguide. The geometry and material of micro-resonator 1260 may be selected such that the IR light coupled into micro-resonator 1260, and the visible light (signal wave) and idler wave generated by the DFWM process may resonate in micro-resonator 1260, which may enhance the DFWM process. In some embodiments, micro-resonator 1260 may include a material (e.g., SiN, SiC, etc.) that has a high refractive index, such that the physical dimension of micro-resonator 1260 may be reduced while achieving the desired optical path length of the closed-looped waveguide. VCSEL 1220, waveguide 1250, and micro-resonator 1260 may be surrounded by dielectric materials 1270, which may include, for example, an oxide such as silicon dioxide.

In some embodiments, visible light generated in micro-resonator 1260 by the DFWM process may be vertically coupled out of micro-resonator 1260 by a coupling structure, such as a grating or nano-resonators described above. The visible light coupled out of micro-resonator 1260 may be vertically coupled out of visible light source 1200 into free space. In some embodiments, visible light generated in micro-resonator 1260 may be coupled to a waveguide (e.g., waveguide 1250 or another waveguide closely coupled to micro-resonator 1260) and a photonic integrated circuit as described with respect to FIGS. 9C and 9D.

In some embodiments, a feedback cavity structure (a DBR structure or a hot mirror that reflects IR light and transmits visible light) may be formed on top of waveguide 1250 and coupling structure 1252 to redirect IR light that is not coupled into waveguide 1250 yet back to waveguide 1250 to improve the efficiency of coupling the IR pump light into waveguide 1250 and the efficiency of visible light source 1200.

Figure 12C:
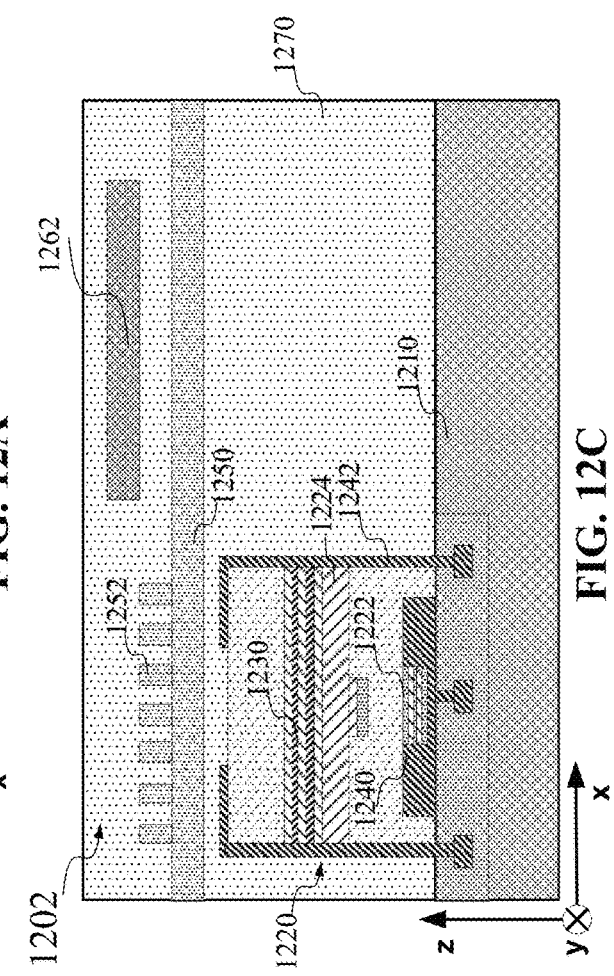
FIGS. 12C and 12D illustrate an example of a visible light source including a micro-resonator pumped by an infrared light VCSEL according to certain embodiments, where the infrared light is coupled into the micro-resonator through an input coupling structure and a waveguide on a different vertical layer from the micro-resonator.
Figure 12D:
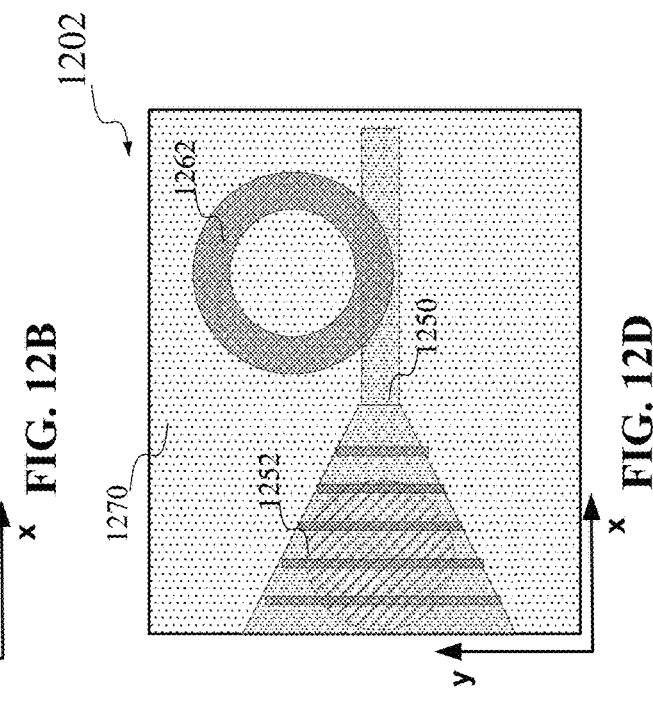

FIG. 12C illustrates an example of a visible light source 1202 including a micro-resonator 1262 pumped by infrared light VCSEL 1220 according to certain embodiments, where the infrared light is coupled into micro-resonator 1262 through coupling structure 1252 and waveguide 1250 that is on a different vertical layer from micro-resonator 1262. FIG. 12D illustrates a top view of the example of visible light source 1202 of FIG. 12C. Visible light source 1202 may be similar to visible light source 1200 but may differ in, for example, in visible light source 1202, micro-resonator 1262 and waveguide 1250 are on different waveguide layers. In the illustrated example, micro-resonator 1262 may be above waveguide 1250. In some embodiments, micro-resonator 1262 may be below waveguide 1250. Even though not shown in FIGS. 12C and 12D, visible light source 1202 may include a coupling structure (e.g., a grating or nano-resonators) configured to vertically couple visible light generated in micro-resonator 1262 out of micro-resonator 1262, or may include a waveguide closely coupled to micro-resonator 1262 and configured to couple visible light generated in micro-resonator 1262 into a photonic integrated circuit.

FIG. 13A illustrates yet another example of a visible light source 1300 including a micro-resonator 1370 pumped by an infrared light VCSEL 1320 in a vertical cavity according to certain embodiments, where the infrared light is coupled into micro-resonator 1370 through an input coupling structure 1352 in the vertical cavity and a waveguide 1350 on a same vertical layer as micro-resonator 1370. FIG. 13B illustrates a top view of the example of visible light source 1300 of FIG. 13A. The vertical cavity in visible light source 1300 may be formed by a first reflector 1322 and a second reflector 1330, where first reflector 1322 and second reflector 1330 may have a high reflectivity (e.g., >80%, >85%, >90%, >95%, >99%, or higher) for IR light.

Visible light source 1300 may include a drive circuit 1310 that may be bonded directly or indirectly (e.g., through an interposer or a thin-film transistor layer) to VCSEL 1320 by, for example, die-to-wafer or wafer-to-wafer bonding. Drive circuit 1310 may include various circuits formed on a silicon substrate as described above, for example, with respect to FIG. 6. Drive circuit 1310 may be bonded to the electrodes of VCSEL 1320 to drive VCSEL 1320 to generated continuous-wave (CW) or pulsed IR light having a sufficiently long duration and a desired intensity. The intensity of the IR light emitted by VCSEL 1320 and thus the intensity of the visible light from visible light source 1300 may be controlled by the drive current or voltage supplied to VCSEL 1320 by drive circuit 1310.

VCSEL 1320 may include a first electrode 1340 (e.g., anode or cathode), a second electrode 1342, and a semiconductor structure (e.g., epitaxial layers) formed between first electrode 1340 and second electrode 1342. The semiconductor structure may include, for example, first reflector 1322, an active region 1324 that may emit IR light, and other semiconductor layers (not labeled in FIG. 13A), such as cladding layers or carrier injection layers that may be p-doped or n-doped, as described above with respect to FIG. 7. First reflector 1322 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1324 may include, for example, InGaAs quantum well layers and GaAs barrier layers, InAlGaAs quantum well layers and AlGaAs barrier layers, or the like.

In some embodiments, VCSEL 1320 may include a partial reflector 1326 for IR light, where the partial reflector may partially reflect and partially transmit IR light emitted in active region 1324 to form a resonant cavity for VCSEL 1320 with first reflector 1322. The resonant cavity formed by partial reflector 1326 and first reflector 1322 may help to narrow and select the output wavelength range of the IR light and improve the gain and the intensity of the emitted IR light. In some embodiments, VCSEL 1320 may include a polarizer 1328. Polarizer 1328 may be used to control the polarization mode of IR light emitted by VCSEL 1320 and improve the coupling efficiency of the IR light into waveguide 1350 by input coupling structure 1352 (e.g., a grating coupler or nano-resonators), which may be polarization dependent. In some embodiments, other polarization components, such as a waveplate, a spatially-variant polarizer, or a spatially-variant waveplate, may be used instead to control the polarization state of IR light emitted by VCSEL 1320.

The IR light emitted by VCSEL 1320 may be coupled into waveguide 1350 by input coupling structure 1352, such as a slanted grating or nano-resonators (e.g., meta-structures). The IR light propagating in waveguide 1350 may be coupled into micro-resonator 1370. In the illustrated example, waveguide 1350 and micro-resonator 1370 may be on a same waveguide material layer (e.g., a SiN or SiC layer). As described above, micro-resonator 1370 may include a closed-looped waveguide having any suitable shape (e.g., a ring, oval, spiral, racetrack shape) and having a low loss such that a photon may propagate in the closed-looped waveguide for a long period of time (e.g., about 1 million or more loops) before being absorbed, scattered, or converted. The waveguide material may have a third-order nonlinearity, such that an OPO (e.g., DFWM) process may occur in the closed-looped waveguide. The size and material of micro-resonator 1370 may be selected such that the IR light coupled into micro-resonator 1370, and the visible light (signal wave) and idler wave generated by the DFWM process may resonate in micro-resonator 1370, which may enhance the DFWM process. In some embodiments, micro-resonator 1370 may include a material (e.g., SiN, SiC, or the like) that has a high refractive index, such that the physical dimension of micro-resonator 1370 may be reduced while still achieving the desired optical path length of the closed-looped waveguide. VCSEL 1320, waveguide 1350, and micro-resonator 1370 may be surrounded by dielectric materials 1360, which may include, for example, an oxide such as silicon dioxide.

In some embodiments, visible light generated in micro-resonator 1370 by the DFWM process may be vertically coupled out of micro-resonator 1370 by a coupling structure, such as a grating or nano-resonators described above. The visible light coupled out of micro-resonator 1370 may be vertically coupled out of visible light source 1300. In some embodiments, visible light generated in micro-resonator 1370 may be coupled to a waveguide (e.g., waveguide 1350 or another waveguide closely coupled to micro-resonator 1370) and a photonic integrated circuit as described with respect to FIGS. 9C and 9D.

As first reflector 1322, second reflector 1330 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1330 for IR light. As such, IR light that is emitted by VCSEL 1320 and is not coupled into waveguide 1350 yet may be reflected back to waveguide 1350 by second reflector 1330 and/or first reflector 1322, and may be at least partially coupled into waveguide 1350 to improve the efficiency of coupling the IR pump light into micro-resonator 1370 and the efficiency of visible light source 1300.

Figure 13D:
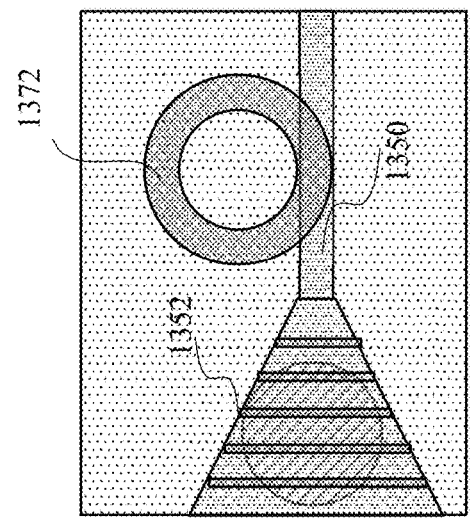
FIG. 13D illustrates a top view of the example of the visible light source of FIG. 13C.
Figure 13C:
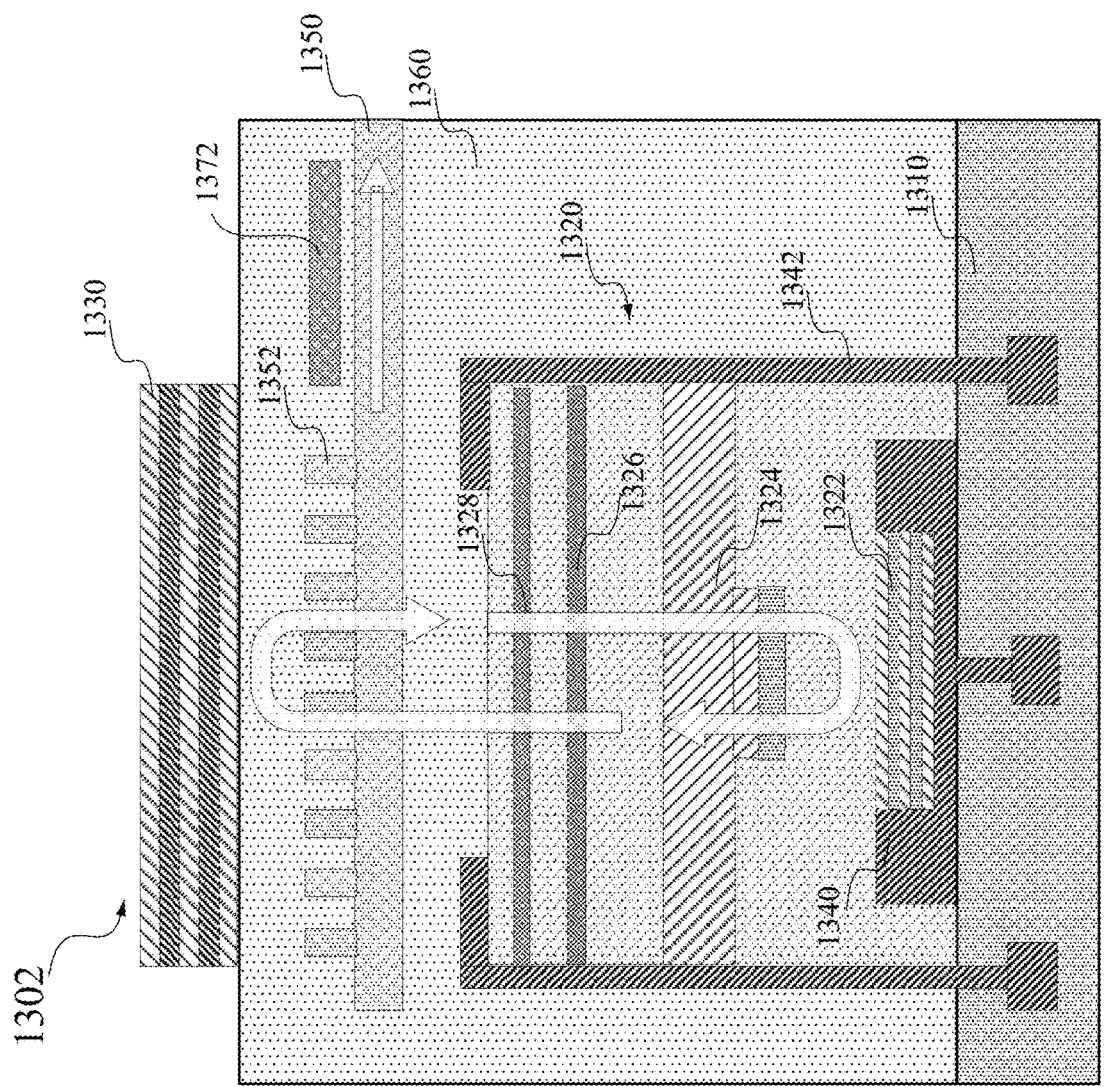
FIG. 13C illustrates an example of a visible light source including a micro-resonator pumped by an infrared light VCSEL in a vertical cavity according to certain embodiments, where the infrared light is coupled into the micro-resonator through an input coupling structure in the vertical cavity and a waveguide on a different vertical layer as the micro-resonator.

FIG. 13C illustrates an example of a visible light source 1302 including a micro-resonator 1372 pumped by infrared light VCSEL 1320 according to certain embodiments, where infrared light emitted by infrared light VCSEL 1320 is coupled into micro-resonator 1372 through input coupling structure 1352 in the vertical cavity and waveguide 1350 on a different vertical layer from micro-resonator 1372. FIG. 13D illustrates a top view of the example of visible light source 1302 of FIG. 13C. Visible light source 1302 may be similar to visible light source 1300 but may differ in, for example, in visible light source 1302, micro-resonator 1372 and waveguide 1350 are on different waveguide layers. In the illustrated example, micro-resonator 1372 may be above waveguide 1350. In some embodiments, micro-resonator 1372 may be below waveguide 1350. Even though not shown in FIGS. 13C and 13D, visible light source 1302 may include a coupling structure (e.g., a grating or nano-resonators) configured to vertically couple visible light generated in micro-resonator 1372 out of micro-resonator 1372, or may include a waveguide closely coupled to micro-resonator 1372 and configured to couple visible light generated in micro-resonator 1372 into a photonic integrated circuit.

In color image display systems, it may be desirable to integrate visible light sources for multiple colors on a same chip. To improve resolution of the displayed images, it may also be desirable to use a high-density source array with a large number of individually addressable light sources. Current visible light sources may generally have large footprints and may not be suitable for high-density source arrays with individual addressable light sources. VCSEL-pumped visible light sources described above may be used to make a high-density source array that includes individual addressable light sources for visible light of different colors.

According to certain embodiments, a device may include an array of visible light sources, where the visible light sources may emit visible light of different colors, such as red, blue, or green. In one example, each visible light source may include one micro-resonator, and the micro-resonators (and/or VCSELs) in some visible light sources may be different from the micro-resonators (and/or VCSELs) in some other visible light sources, such that the visible light sources may emit light of different colors. In some embodiments, each visible light source in the array of visible light source may be configured or tunable to emit light of different colors. For example, each visible light source may include a pump VCSEL and multiple micro-resonators having different parameters, where each of the multiple micro-resonators may be configured to generate visible light of a different respective color, and, in some embodiments, each of the multiple micro-resonators may be tuned to adjust the intensity of the visible light generated by the micro-resonator. In some embodiments, a visible light source may include a tunable pump VCSEL (having a tunable cavity) that may be tuned to emit pump light having different wavelengths, and a micro-resonator that may have multiple resonant modes and may generate visible light of different colors using the pump light having different wavelengths.

FIG. 14A illustrates an example of an array of visible light sources 1400 configured to emit visible light of different colors according to certain embodiments, where each visible light source in the array includes a micro-resonator in a vertical cavity and directly pumped by an infrared light VCSEL in the vertical cavity, and the visible light generated in the micro-resonator is coupled vertically out of the vertical cavity. FIG. 14A shows a red light source 1406, a green light source 1404, and a blue light source 1402 in the array of visible light sources 1400. Each light source shown in FIG. 14A may be an example of visible light source 1000 or 1100, and the visible light sources in the array of visible light sources may be fabricated on a same wafer or a same die. The wafer or die may be bonded directly or indirectly (e.g., through an interposer or a thin-film transistor layer) to a drive circuit 1410, such as a CMOS backplane, using various wafer-to-wafer bonding techniques or die-to-wafer bonding techniques.

Each light source 1402, 1404, or 1406 may include a VCSEL 1420 that emits IR light. As described above with respect to, for example, FIGS. 10 and 11, VCSEL 1420 may include a first electrode 1430 (e.g., anode or cathode), a second electrode 1432, and a semiconductor structure (e.g., epitaxial layers) formed between first electrode 1430 and second electrode 1432. The semiconductor structure may include, for example, first reflector 1422, an active region 1424 that may emit IR light, and other semiconductor layers (not labeled in FIG. 14A), such as cladding layers or carrier injection layers that may be p-doped or n-doped, as described above with respect to FIG. 7. First reflector 1422 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1424 may include, for example, InGaAs quantum well layers and GaAs barrier layers, InAlGaAs quantum well layers and AlGaAs barrier layers, or the like. VCSELs 1420 in light sources 1402, 1404, and 1406 may have the same structure and may emit IR light at about the same wavelength. In some embodiments, VCSEL 1420 may include a partial reflector for IR light (such as partial reflector 1026, not shown in FIG. 14A), where the partial reflector may partially reflect and partially transmit IR light emitted in active region 1424 to form a resonant cavity for VCSEL 1420 with first reflector 1422. The resonant cavity formed by the partial reflector and first reflector 1422 may help to narrow and select the output wavelength range of the IR light emitted by VCSELs 1420 and improve the gain and the intensity of the emitted IR light. In some embodiments, VCSEL 1420 may include a polarizer (not shown in FIG. 14A), such as polarize 1028. The polarizer may be used to control the polarization mode of IR light emitted by VCSEL 1420 and improve the coupling efficiency of the IR light into the micro-resonator by, for example, a grating coupler or nano-resonators (e.g., meta-structures), which may be polarization dependent.

In the illustrated example, each light source 1402, 1404, or 1406 may include a micro-resonator, where the micro-resonator for each light source 1402, 1404, or 1406 may have a different respective design and thus may generate visible light of different wavelengths. The different respective design may include a different combination of, for example, loop shape (e.g., ring, oval, spiral, racetrack, etc.), dimension, material (and thus refractive index), and the like. For example, red light source 1406 may include a micro-resonator 1444, the shape, dimension, and material of which may be selected such that red light may be generated in micro-resonator 1444 by DFWM using the IR light emitted by VCSEL 1420 as the pump light. Red light source 1406 may also include a coupling structure 1454 configured to vertically couple the red light generated in micro-resonator 1444 out of micro-resonator 1444. Similarly, green light source 1404 may include a micro-resonator 1442 configured such that green light may be generated in micro-resonator 1442 by DFWM using the IR light emitted by VCSEL 1420 as the pump light, and may include a coupling structure 1452 configured to vertically couple the green light generated in micro-resonator 1442 out of micro-resonator 1442. Blue light source 1402 may include a micro-resonator 1440 configured such that green light may be generated in micro-resonator 1440 by DFWM using the IR light emitted by VCSEL 1420 as the pump light, and may include a coupling structure 1450 configured to vertically couple the blue light generated in micro-resonator 1440 out of micro-resonator 1440.

As illustrated, each light source 1402, 1404, or 1406 may also include a second reflector 1460, 1462, or 1464 configured to reflect IR light that is emitted by VCSEL 1420 but has not been coupled into the micro-resonator yet back to the micro-resonator or a coupling structure for coupling the IR light into the micro-resonator. Second reflector 1460, 1462, or 1464 may have a close to 100% reflectivity for IR light emitted by VCSEL 1420 and may have a close to 0% reflectivity for the visible light generated in the corresponding micro-resonators and coupled out of the corresponding micro-resonators by corresponding coupling structures. For example, second reflector 1460 may be anti-reflective for blue light, second reflector 1462 may be anti-reflective for green light, and second reflector 1464 may be anti-reflective for red light.

FIGS. 14B and 14C illustrate top views of examples of the array of visible light sources 1400. The examples of the array of visible light sources 1400 shown in FIGS. 14B and 14C may be used as an active display panel or may be used as the light sources for the backlight units of liquid crystal displays, such as liquid crystal on silicon (LCOS) displays. In the illustrated examples, red light sources 1406 may be grouped in some columns, green light sources 1404 may be grouped in some other columns, and blue light sources 1402 may be grouped in some other columns, where the columns of light sources for different colors may be interleaved. In some embodiments, light sources 1402, 1404, and 1406 may be arranged in other manners. For example, the array of visible light sources may include pixel units arranged in a two-dimensional array, where each pixel unit may include a red light source 1406, a green light source 1404, and a blue light source 1402 arranged on the vertices of a triangle. The light sources of different colors in an array of light sources may be fabricated on a same wafer or a same die using a same process, rather than being manufactured separately and then pick-and-placed on a CMOS backplane. The pitch of the array of visible light sources 1400 and the size of each light source may be selected based on the applications. In some embodiments, the diameters of each light source may be less than about 50 µm, less than about 30 µm, less than about 20 µm, or less than about 10 µm. The pitch of the array of visible light sources 1400 may also be less than about 50 µm, less than about 30 µm, less than about 20 µm, or less than about 10 µm.

FIGS. 15A and 15B illustrate an example of an array of visible light sources 1500 according to certain embodiments, where each visible light source 1502 may emit visible light in multiple colors. Each visible light source 1502 in the array of visible light sources 1500 includes multiple micro-resonators positioned in a vertical cavity formed by a first reflector 1522 and a second reflector 1530, where the multiple micro-resonators are pumped by a same IR-emitting VCSEL 1520 in the vertical cavity to generate visible light of different colors. First reflector 1522 and second reflector 1530 may have a high reflectivity (e.g., >80%, >85%, >90%, >95%, >99%, or higher) for IR light. In some embodiments, first reflector 1522 may have a high reflectivity (e.g., >80%, >85%, >90%, >95%, >99%, or higher) for visible light. Second reflector 1530 may be anti-reflective for visible light. The visible light of different colors generated in the micro-resonators is vertically coupled out of the micro-resonators by respective coupling structures, and may be transmitted out of the vertical cavity through second reflector 1530.

As illustrated, visible light source 1502 may include a drive circuit 1510 formed on a CMOS backplane, where the CMOS backplane may be bonded directly or indirectly (e.g., through an interposer or a thin-film transistor layer) to a wafer including VCSELs 1520 fabricated thereon. The multiple micro-resonators and second reflector 1530 may be formed before or after bonding the wafer including VCSELs 1520 to the CMOS backplane. VCSEL 1520 may include a first electrode 1540 (e.g., anode or cathode), a second electrode 1542, and a semiconductor structure (e.g., epitaxial layers) formed between first electrode 1540 and second electrode 1542. The semiconductor structure may include, for example, first reflector 1522, an active region 1524 that may emit IR light, and other semiconductor layers (not labeled in FIG. 15A), such as cladding layers or carrier injection layers that may be p-doped or n-doped. First reflector 1522 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1524 may include, for example, InGaAs quantum well layers and GaAs barrier layers, InAlGaAs quantum well layers and AlGaAs barrier layers, or the like. In some embodiments, VCSEL 1520 may include a partial reflector 1526 for IR light, where partial reflector 1526 may partially reflect and partially transmit IR light emitted in active region 1524 to form a resonant cavity for VCSEL 1520 with first reflector 1522. The resonant cavity formed by partial reflector 1526 and first reflector 1522 may help to narrow and select the output wavelength range of the IR light emitted by VCSEL 1520 and improve the gain and the intensity of the emitted IR light. In some embodiments, VCSEL 1520 may include a polarizer 1528. Polarizer 1528 may be used to control the polarization mode of IR light emitted by VCSEL 1520 and improve the coupling efficiency of the IR light into the micro-resonator by, for example, a grating coupler or nano-resonators (e.g., meta-structures), which may be polarization dependent. In some embodiments, other polarization components, such as a waveplate, a spatially-variant polarizer, or a spatially-variant waveplate, may be used instead to control the polarization state of IR light emitted by VCSEL 1520.

In the illustrated example, each visible light source 1502 may include a first micro-resonator 1550, a second micro-resonator 1560, and a third micro-resonator 1570 for generating visible light of different colors using IR light emitted by VCSEL 1520 as pump light in DFWM processes. First micro-resonator 1550, second micro-resonator 1560, and third micro-resonator 1570 may have different respective designs, and thus may generate visible light of different colors using the same pump light. The different respective designs may include different combinations of, for example, loop shape (e.g., ring, oval, spiral, racetrack, etc.), dimension, material (and thus refractive index), and the like. For example, the shape, dimension, and material of third micro-resonator 1570 may be selected such that red light may be generated in third micro-resonator 1570 by DFWM using the IR light emitted by VCSEL 1520 as the pump light. A coupling structure 1572 (e.g., a grating or nano-resonators) may be configured to vertically couple the red light generated in third micro-resonator 1570 out of third micro-resonator 1570. Similarly, the shape, dimension, and material of second micro-resonator 1560 may be selected such that green light may be generated in second micro-resonator 1560 by DFWM using the IR light emitted by VCSEL 1520 as the pump light. A coupling structure 1562 (e.g., a grating or nano-resonators) may be configured to vertically couple the green light generated in second micro-resonator 1560 out of second micro-resonator 1560. The shape, dimension, and material of first micro-resonator 1550 may be selected such that blue light may be generated in first micro-resonator 1550 by DFWM using the IR light emitted by VCSEL 1520 as the pump light. A coupling structure 1552 (e.g., a grating or nano-resonators) may be configured to vertically couple the blue light generated in first micro-resonator 1550 out of first micro-resonator 1550. First micro-resonator 1550, second micro-resonator 1560, and third micro-resonator 1570 may be arranged vertically in any suitable order. In some embodiments, each visible light source 1502 may include two or more different micro-resonators configured to generate visible light in two or more colors. In some embodiments, each visible light source 1502 may include multiple micro-resonators, where at least two of the micro-resonators may be configured to generate visible light of the same color.

The visible light coupled out of first micro-resonator 1550, second micro-resonator 1560, and third micro-resonator 1570 may be coupled out of visible light source 1502 through second reflector 1530 with little or no loss since second reflector 1530 may be anti-reflective for visible light as described above. As first reflector 1522, second reflector 1530 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1530 for IR light, while visible light reflected at adjacent interfaces between different materials may destructively interfere to reduce the overall reflectivity of second reflector 1530 for visible light. As such, IR light that is emitted by VCSEL 1520 and is not coupled into the micro-resonators yet may be reflected back to the micro-resonators by second reflector 1530 and/or first reflector 1522, and may be at least partially coupled into the micro-resonators to improve the efficiency of coupling the IR pump light into the micro-resonators and the efficiency of visible light source 1502. Thus, each visible light source 1502 may emit visible light in different colors at the same time, where the intensity of the emitted visible light in different colors may be controlled by the drive voltage or current from drive circuit 1510. In the example shown in FIGS. 15A and 15B, the respective intensity of the visible light in each color emitted by a same visible light source may not be individually controllable. Thus, the array of visible light sources 1500 may be used as light sources in BLU display, but may not be used as display pixels for an active display panel. The micro-resonators, the coupling structures, and second reflector 1530 in visible light source 1502 may be formed before or after bonding VCSEL 1520 to drive circuit 1510.

Figures 16A, 16B:
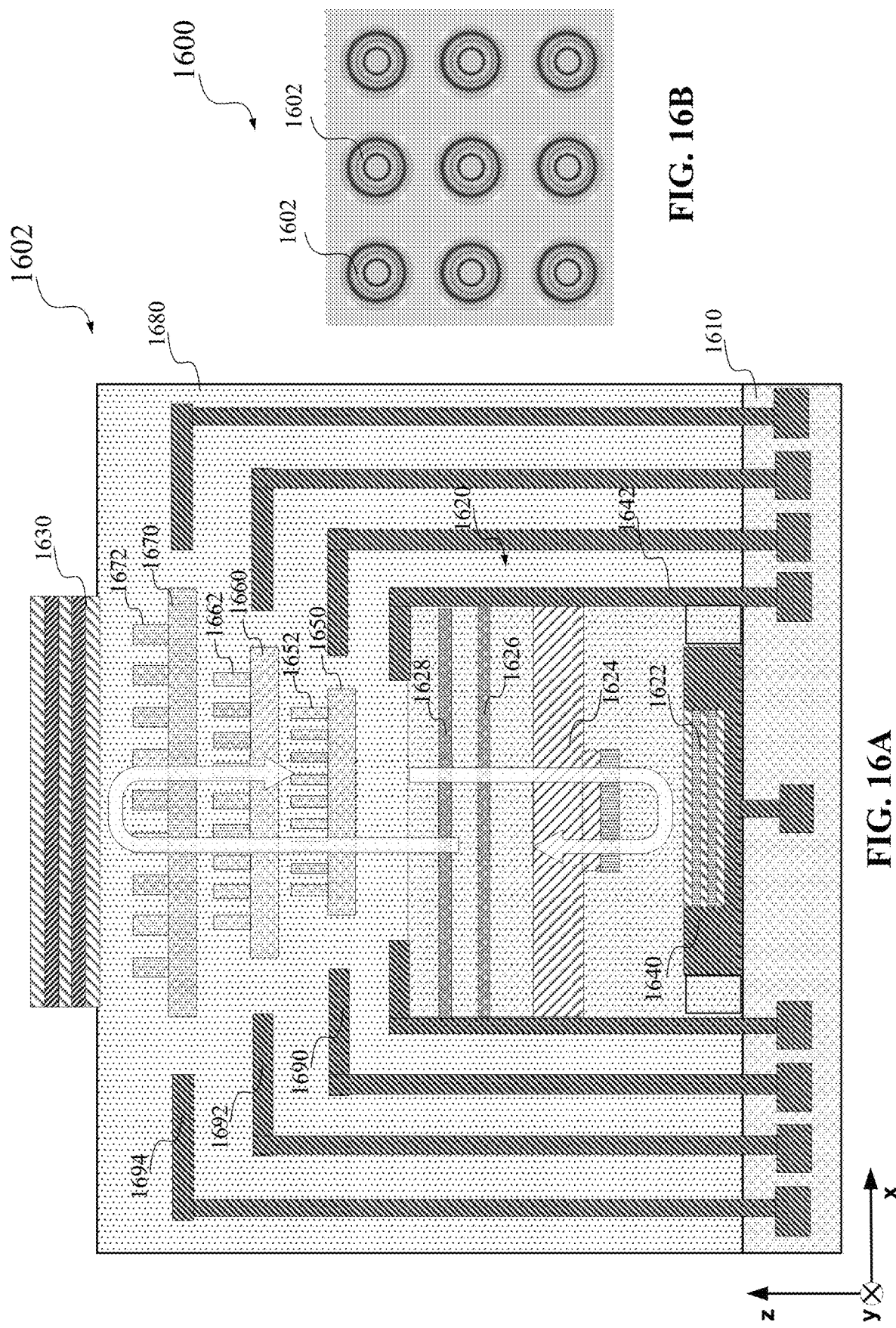
FIG. 16A illustrates an example of an array of visible light sources according to certain embodiments, where each visible light source is configured to emit visible light in multiple colors and the respective intensity of the visible light in each color is individually controllable.
FIG. 16B illustrates a top view of the example of the array of visible light sources of FIG. 16A.

FIGS. 16A and 16B illustrate an example of an array of visible light sources 1600 according to certain embodiments, where each visible light source 1602 is configured to emit visible light in multiple colors and the respective intensity of the visible light in each color is individually controllable. Compared with the array of visible light sources 1500, the array of visible light sources 1600 may not only have individual control over each visible light source 1602, but also have individual control over the micro-resonators in a same visible light source 1602 such that the respective intensity of the emitted visible light in each color may be individually tunable.

As illustrated in FIG. 16A, each visible light source 1602 in the array of visible light sources 1600 includes multiple micro-resonators in a vertical cavity formed by a first reflector 1622 and a second reflector 1630, where the multiple micro-resonators are pumped by a same IR VCSEL 1620 in the vertical cavity to generate visible light of different colors. First reflector 1622 and second reflector 1630 may have a high reflectivity (e.g., >80%, >85%, >90%, >95%, >99%, or higher) for IR light. In some embodiments, first reflector 1622 may have a high reflectivity (e.g., >80%, >85%, >90%, >95%, >99%, or higher) for visible light. Second reflector 1630 may be anti-reflective for visible light. The visible light of different colors generated in the micro-resonators is vertically coupled out of the micro-resonators by respective coupling structures, and may be transmitted out of the vertical cavity through second reflector 1630.

Visible light source 1602 may include a drive circuit 1610 formed on a CMOS backplane, where the CMOS backplane may be bonded directly or indirectly (e.g., through an interposer or a thin-film transistor layer) to a wafer including VCSELs 1620 fabricated thereon. The multiple micro-resonators and second reflector 1630 may be formed before or after bonding the wafer including VCSELs 1620 to the CMOS backplane. VCSEL 1620 may include a first electrode 1640 (e.g., anode or cathode), a second electrode 1642, and a semiconductor structure (e.g., epitaxial layers) formed between first electrode 1640 and second electrode 1642. The semiconductor structure may include, for example, first reflector 1622, an active region 1624 that may emit IR light, and other semiconductor layers (not labeled in FIG. 16A), such as cladding layers or carrier injection layers that may be p-doped or n-doped. First reflector 1622 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1624 may include, for example, InGaAs quantum well layers and GaAs barrier layers, InAlGaAs quantum well layers and AlGaAs barrier layers, or the like. In some embodiments, VCSEL 1620 may include a partial reflector 1626 for IR light, where partial reflector 1626 may partially reflect and partially transmit IR light emitted in active region 1624 to form a resonant cavity for VCSEL 1620 with first reflector 1622. The resonant cavity formed by partial reflector 1626 and first reflector 1622 may help to narrow and select the output wavelength range of the IR light emitted by IR VCSELs 1620 and improve the gain and the intensity of the emitted IR light. In some embodiments, VCSEL 1620 may include a polarizer 1628. Polarizer 1628 may be used to control the polarization mode of the IR light emitted by VCSEL 1620 and improve the coupling efficiency of the IR light into the micro-resonator by, for example, a grating coupler or nano-resonators (e.g., metastructures), which may be polarization dependent. In some embodiments, other polarization components, such as a waveplate, a spatially-variant polarizer, or a spatially-variant waveplate, may be used instead to control the polarization state of IR light emitted by VCSEL 1620.

In the illustrated example, each visible light source 1602 may include a first micro-resonator 1650, a second micro-resonator 1660, and a third micro-resonator 1670 for generating visible light of different colors using IR light emitted by VCSEL 1620 as pump light in DFWM processes. First micro-resonator 1650, second micro-resonator 1660, and third micro-resonator 1670 may have different respective designs and thus may generate visible light of different colors using the same pump light. The different respective designs may include different combinations of, for example, loop shape (e.g., ring, oval, spiral, racetrack, etc.), dimension, material (and thus refractive index), and the like. For example, the shape, dimension, and material of third micro-resonator 1670 may be selected such that red light may be generated in third micro-resonator 1670 by DFWM using the IR light emitted by VCSEL 1620 as the pump light. A coupling structure 1672 (e.g., a grating or nano-resonators) may be configured to vertically couple the red light generated in third micro-resonator 1670 out of third micro-resonator 1670. Similarly, the shape, dimension, and material of second micro-resonator 1660 may be selected such that green light may be generated in second micro-resonator 1660 by DFWM using the IR light emitted by VCSEL 1620 as the pump light. A coupling structure 1662 (e.g., a grating or nano-resonators) may be configured to vertically couple the green light generated in second micro-resonator 1660 out of second micro-resonator 1660. The shape, dimension, and material of first micro-resonator 1650 may be selected such that blue light may be generated in first micro-resonator 1650 by DFWM using the IR light emitted by VCSEL 1620 as the pump light. A coupling structure 1652 (e.g., a grating or nano-resonators) may be configured to vertically couple the blue light generated in first micro-resonator 1650 out of first micro-resonator 1650. First micro-resonator 1650, second micro-resonator 1660, and third micro-resonator 1670 may be arranged vertically in any suitable order. In some embodiments, each visible light source 1602 may include two or more different micro-resonators configured to generate visible light in two or more different colors. In some embodiments, each visible light source 1602 may include multiple micro-resonators, where at least two micro-resonators of the multiple micro-resonators may be configured to generate visible light of the same color.

The visible light coupled out of first micro-resonator 1650, second micro-resonator 1660, and third micro-resonator 1670 may be coupled out of visible light source 1602 through second reflector 1630 with little or no loss since second reflector 1630 may be anti-reflective for visible light as described above. As first reflector 1622, second reflector 1630 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1630 for IR light, while visible light reflected at adjacent interfaces between different materials may destructively interfere to reduce the overall reflectivity of second reflector 1630 for visible light. As such, IR light that is emitted by VCSEL 1620 and is not coupled into the micro-resonators yet may be reflected back to the micro-resonators by second reflector 1630 and/or first reflector 1622, and may be at least partially coupled into the micro-resonators to improve the efficiency of coupling the IR pump light into the micro-resonators and the efficiency of visible light source 1602. The micro-resonators, the coupling structures, and second reflector 1630 in visible light source 1602 may be formed before or after bonding VCSEL 1620 to drive circuit 1610.

Visible light source 1602 may include additional electrodes for tuning the respective intensity of the visible light of each color generated by and coupled out of the corresponding micro-resonator. For example, electrodes 1690 may be used to modulate the intensity of blue light coupled out of first micro-resonator 1650, electrodes 1692 may be used to modulate the intensity of green light coupled out of second micro-resonator 1660, and electrodes 1694 may be used to modulate the intensity of red light coupled out of third micro-resonator 1670. Electrodes 1690 may be used to tune at least one of first micro-resonator 1650, the coupling structure for coupling the IR light emitted by VCSEL 1620 into first micro-resonator 1650, or coupling structure 1652 for coupling blue light generated in first micro-resonator 1650 to modulate the intensity of the blue light emitted from visible light source 1602. For example, electrodes 1690 may be used to apply a voltage on an electro-optic material or to supply a current signal to a thermo-optic device to change the refractive index of first micro-resonator 1650 or the coupling structure, thereby changing the resonant condition of first micro-resonator 1650 or the coupling efficiency of the coupling structure for first micro-resonator 1650 and thus the intensity of the emitted blue light. Similarly, electrodes 1692 may be used to change the resonant condition of second micro-resonator 1660 or the coupling efficiency of the coupling structure for second micro-resonator 1660 and thus the intensity of the emitted green light. Electrodes 1694 may be used to change the resonant condition of third micro-resonator 1670 or the coupling efficiency of the coupling structure for third micro-resonator 1670 and thus the intensity of the emitted red light. In this way, the intensities of the red, green, and blue light emitted by visible light source 1602 may be independently tuned to desired values to represent a color pixel unit for an active display panel as shown in FIG. 16B, where the pitch of visible light sources 1602 may be less than about 50 μm, less than about 30 μm, less than about 20 μm, or less than about 10 μm.

Figure 17B:
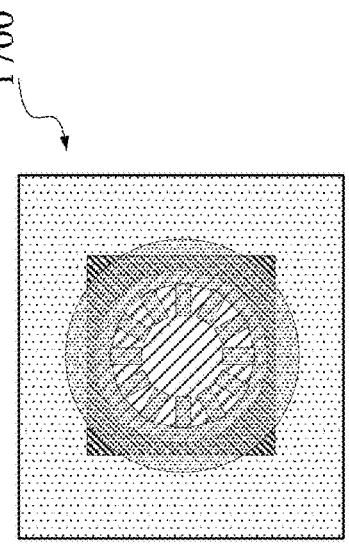
FIG. 17B illustrates a top view of the example of the array of visible light sources of FIG. 17A.
Figure 17C:
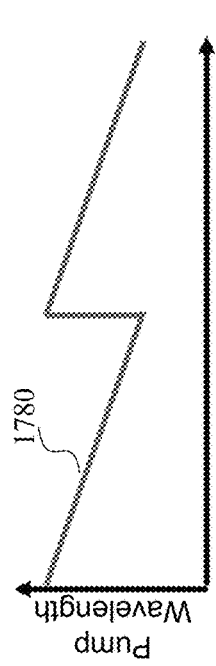
FIGS. 17C and 17D illustrate an example of generating visible light of different colors by tuning the visible light source of FIGS. 17A and 17B.
Figure 17D:
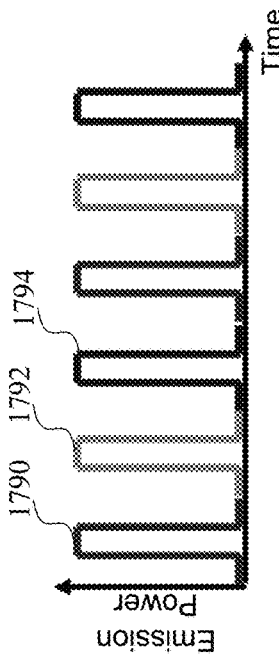
Figure 17A:
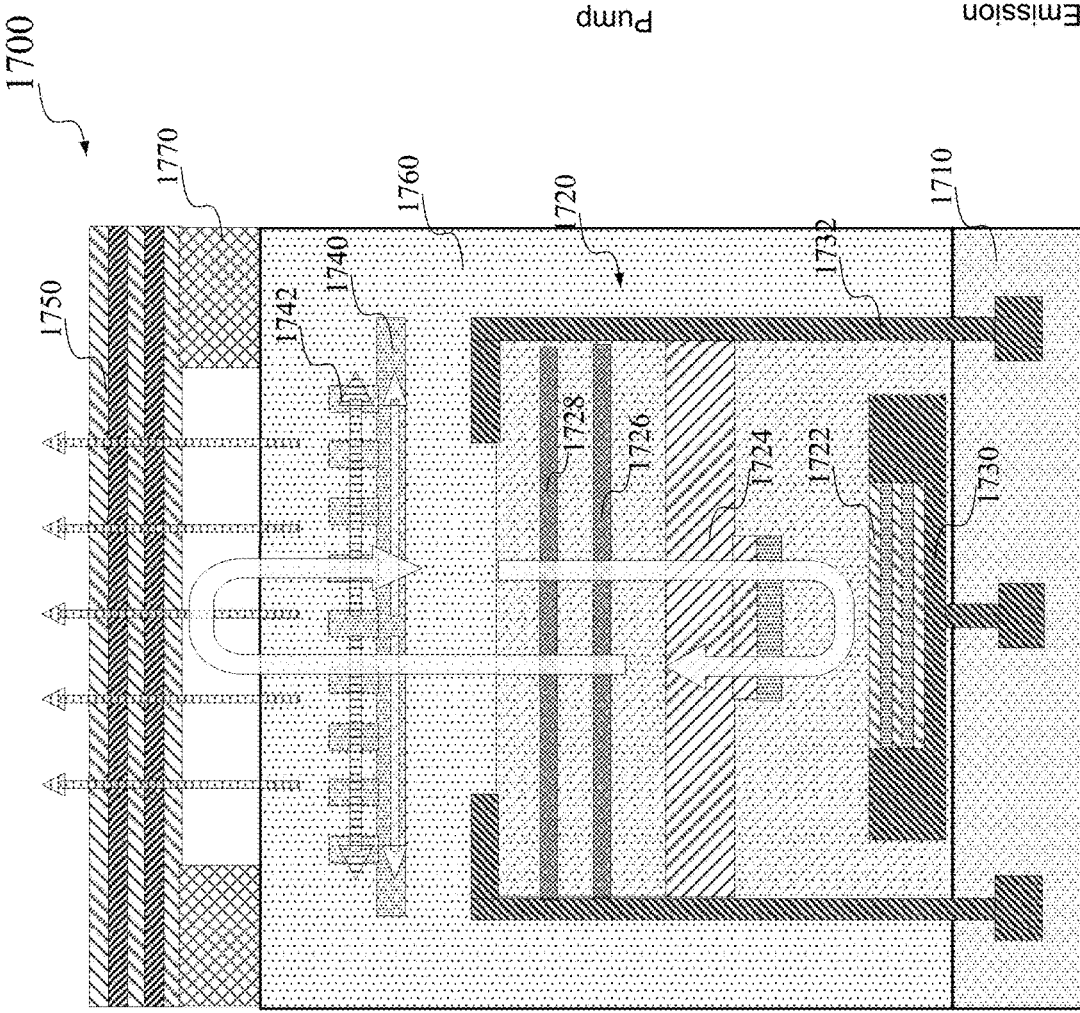
FIG. 17A illustrates an example of a visible light source that is tunable to emit visible light of different colors according to certain embodiments.

FIGS. 17A and 17B illustrate an example of a visible light source 1700 that is tunable to emit visible light of different colors according to certain embodiments. Visible light source 1700 may be an example of a visible light source in an array of visible light sources. FIG. 17A shows a cross-sectional view of visible light source 1700 and FIG. 17B illustrates a top view of visible light source 1700. Visible light source 1700 includes a micro-resonator that is in a tunable vertical cavity and is directly pumped by a tunable infrared light VCSEL in the tunable vertical cavity to generate visible light of different colors. The visible light generated in the micro-resonator is vertically coupled out of the vertical cavity. Compared with visible light source 1502 or 1602, visible light source 1700 may include a single micro-resonator that may generate light of different colors at different times.

In the illustrated example, visible light source 1700 includes a micro-resonator 1740 in a tunable vertical cavity formed by a first reflector 1722 and a second reflector 1750, where second reflector 1750 may be formed on a micro-electro-mechanical-system (MEMS) device 1770 and thus is movable by MEMS device 1770. In some embodiments, other micro-actuators or nano-actuators, such as a micro-motor, a piezoelectric actuator, a ferroelectric actuator, a magnetic actuator, an ultrasonic actuator, or the like, may be used to move second reflector 1750. First reflector 1722 and second reflector 1750 may have a high reflectivity (e.g., 80%, >85%, >90%, >95%, >99%, or higher) for IR light. In some embodiments, first reflector 1722 may have a high reflectivity (e.g., 80%, >85%, >90%, >95%, >99%, or higher) for visible light. Second reflector 1750 may be anti-reflective for visible light. Micro-resonator 1740 may be pumped by an IR-emitting VCSEL 1720 in the vertical cavity to generate visible light. The visible light generated in micro-resonator 1740 may be vertically coupled out of micro-resonator 1740 by a coupling structure 1742, and may be transmitted out of the vertical cavity through second reflector 1750.

Visible light source 1700 may include a drive circuit 1710 formed on a CMOS backplane, where the CMOS backplane may be bonded directly or indirectly (e.g., through an interposer or a thin-film transistor layer) to a wafer including VCSELs 1720 fabricated thereon. Micro-resonator 1740 and second reflector 1750 may be formed before or after bonding the wafer including VCSELs 1720 to the CMOS backplane. VCSEL 1720 may include a first electrode 1730 (e.g., anode or cathode), a second electrode 1732, and a semiconductor structure (e.g., epitaxial layers) formed between first electrode 1730 and second electrode 1732. The semiconductor structure may include, for example, first reflector 1722, an active region 1724 that may emit IR light, and other semiconductor layers (not labeled in FIG. 17A), such as cladding layers or carrier injection layers that may be p-doped or n-doped. First reflector 1722 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1724 may include, for example, InGaAs quantum well layers and GaAs barrier layers, InAlGaAs quantum well layers and AlGaAs barrier layers, or the like. VCSEL 1720 may optionally include a partial reflector 1726 for IR light, where partial reflector 1726 may partially reflect and partially transmit IR light emitted in active region 1724 to form a resonant cavity for VCSEL 1720 with first reflector 1722. The resonant cavity formed by partial reflector 1726 and first reflector 1722 may help to select the output wavelength range of the IR light emitted by VCSEL 1720 and improve the gain and the intensity of the emitted IR light. In some embodiments, VCSEL 1720 may include a polarizer 1728. Polarizer 1728 may be used to control the polarization state of IR light emitted by VCSEL 1720 and improve the coupling efficiency of the IR light into the micro-resonator by, for example, a grating coupler or nano-resonators (e.g., meta-structures), which may be polarization dependent. In some embodiments, other polarization components, such as a waveplate, a spatially-variant polarizer, or a spatially-variant waveplate, may be used instead to control the polarization state of IR light emitted by VCSEL 1720.

As first reflector 1722, second reflector 1750 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1750 for IR light, while visible light reflected at adjacent interfaces between different materials may destructively interfere to reduce the overall reflectivity of second reflector 1750 for visible light. As such, IR light that is emitted by VCSEL 1720 and is not coupled into micro-resonator 1740 yet may be reflected back to micro-resonator 1740 by second reflector 1750 and/or first reflector 1722, such that the IR light emitted by VCSEL 1720 may oscillate within the vertical cavity formed by first reflector 1722 and second reflector 1750 and may be coupled into micro-resonator 1740 at a higher coupling efficiency to improve the efficiency of visible light source 1700.

The wavelength of the IR light resonant in the vertical cavity may be determined by the optical path length of the vertical cavity. Thus, when second reflector 1750 is moved by MEMS device 1770 and thus the optical path length of the vertical cavity is changed, the wavelength of the IR light that resonates in the vertical cavity may be changed. The IR light may be coupled into micro-resonator 1740 directly or through a coupling structure (e.g., a grating or nano-resonator). The shape, dimension, and material of micro-resonator 1740 may be selected such that, when the wavelength of the pump light is changed by tuning the optical path length of the vertical cavity using MEMS device 1770, visible light of different colors may be generated in micro-resonator 1740 through OPO (e.g., DFWM) processes. Coupling structure 1742 (e.g., a grating or nano-resonators) may be configured to vertically couple the visible light generated in micro-resonator 1740 out of micro-resonator 1740. The visible light coupled out of micro-resonator 1740 may be coupled out of visible light source 1700 through second reflector 1750 with little or no loss since second reflector 1750 may be anti-reflective for visible light as described above.

FIGS. 17C and 17D illustrate an example of generating visible light of different colors by tuning visible light source 1700. FIG. 7C shows that the pump light emitted by VCSEL 1720 and oscillating within the vertical cavity formed by first reflector 1722 and second reflector 1750 may be continuously tunable by tuning the location of second reflector 1750 using MEMS device 1770 or another actuator to tune the optical path length and thus the resonant wavelength of the vertical cavity. In the illustrated example, MEMS device 1770 may be driven by a control signal to move second reflector 1750 such that the wavelength of the IR light emitted by VCSEL 1720 and oscillating within the vertical cavity may be linearly changed in time as shown by a curve 1780 in FIG. 7C. When the wavelength of the IR pump light is tuned to a first value, a resonant condition of micro-resonator 1740 may be met and the OPO process may occur to generate signal light 1790 at a first visible wavelength (e.g., red light). When the wavelength of the IR pump light is tuned to a second value, a resonant condition (for a different mode number m) of micro-resonator 1740 may again be met and the OPO process may occur to generate signal light 1792 at a second visible wavelength (e.g., green light). When the wavelength of the IR pump light is tuned to a third value, a resonant condition (for a different mode number m) of micro-resonator 1740 may again be met and the OPO process may occur to generate signal light 1794 at a third visible wavelength (e.g., blue light). In this way, visible light in many different colors may be generated by visible light source 1700.

The control signal may be a periodical signal or may be non-periodic. In some embodiments, the control signal may have a more complex waveform determined by the pixel data of the image to be displayed. For example, the control signal may have multiple different step levels corresponding to different colors, where the duration of each step level for a color pixel in an image frame to be displayed may be determined based on the desired intensity of the corresponding color (e.g., the R, G, B values) for the color pixel of the image frame, such that the temporal combination of the visible light in the different colors emitted during different time periods of the image frame may be perceived by a viewer's eye as a visible light having a single color in the Rec. 2020 color gamut or a larger color gamut. In this way, each visible light source 1700 may be individually controlled to emit light of a desired color at a desired intensity in each image frame. Thus, an array of visible light sources 1700 may be used an active display panel.

Figures 18A, 18B:
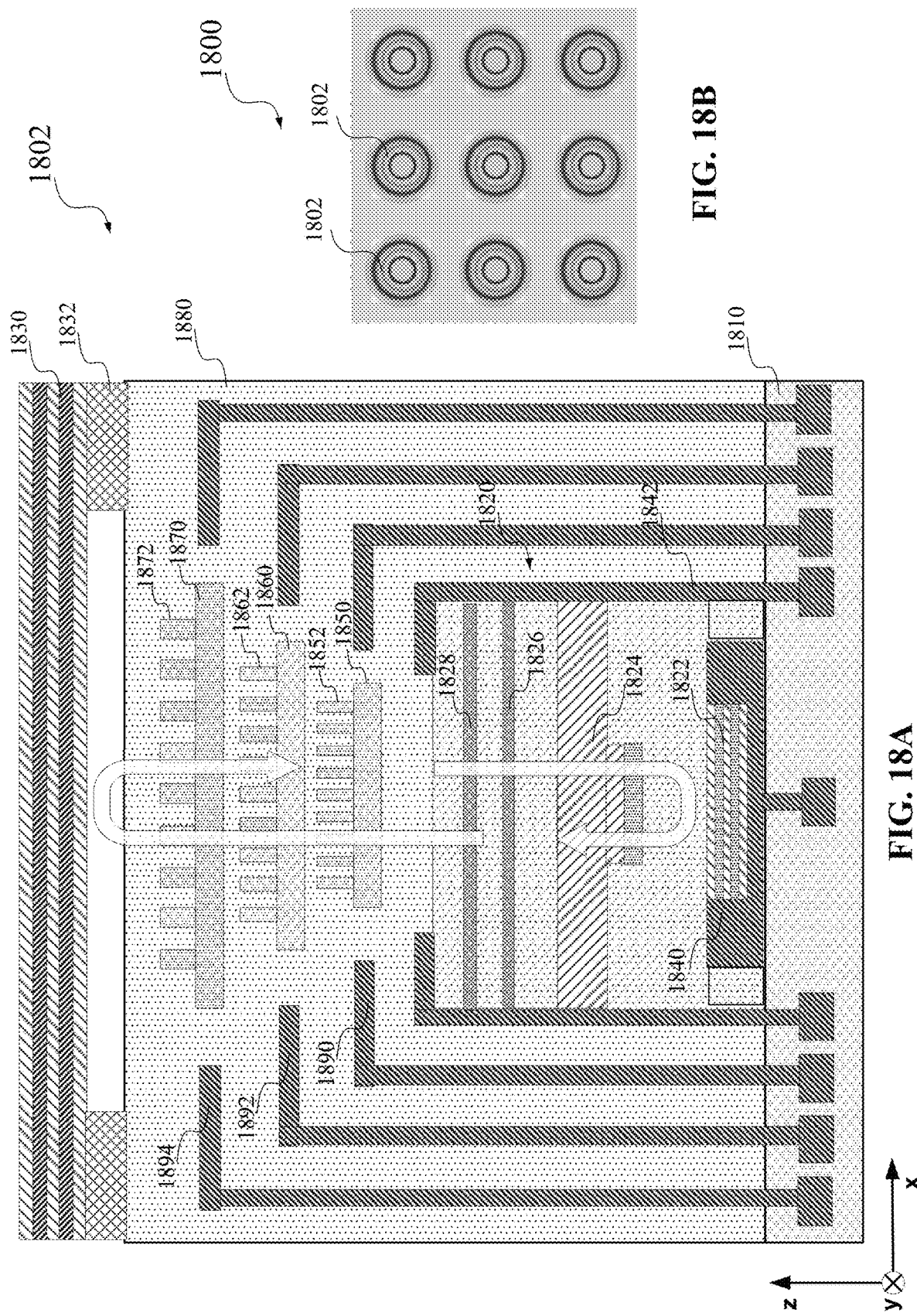
FIG. 18A illustrates an example of an array of visible light sources according to certain embodiments, where each visible light source is tunable to emit visible light in one or more colors and the respective intensity of the visible light in each color is individually controllable.
FIG. 18B illustrates a top view of the example of the array of visible light sources of FIG. 18A.

FIGS. 18A and 18B illustrate an example of an array of visible light sources 1800 according to certain embodiments, where each visible light source 1802 in the array of visible light sources 1800 is configured to emit visible light in one or more colors and the respective intensity of the visible light in each color is individually controllable. As illustrated in FIG. 18A, visible light source 1802 may include one or more micro-resonators in a tunable vertical cavity formed by a first reflector 1822 and a second reflector 1830, where second reflector 1830 may be formed on a MEMS device 1832 and thus is movable by MEMS device 1832. First reflector 1822 and second reflector 1830 may have a high reflectivity (e.g., >80%, >85%, >90%, >95%, >99%, or higher) for IR light. In some embodiments, first reflector 1822 may have a high reflectivity (e.g., >80%, >85%, >90%, >95%, >99%, or higher) for visible light. Second reflector 1830 may be anti-reflective for visible light. The one or more micro-resonators may be directly pumped by an infrared light VCSEL 1820 in the tunable vertical cavity to generate visible light of different colors. The visible light generated in the one or more micro-resonators may be vertically coupled out of the vertical cavity.

Visible light source 1802 may include a drive circuit 1810 formed on a CMOS backplane, where the CMOS backplane may be bonded directly or indirectly (e.g., through an interposer or a thin-film transistor layer) to a wafer including VCSELs 1820 fabricated thereon. The multiple micro-resonators and second reflector 1830 may be formed before or after bonding the wafer including VCSELs 1820 to the CMOS backplane. VCSEL 1820 may include a first electrode 1840 (e.g., anode or cathode), a second electrode 1842, and a semiconductor structure (e.g., epitaxial layers) formed between first electrode 1840 and second electrode 1842. The semiconductor structure may include, for example, first reflector 1822, an active region 1824 that may emit IR light, and other semiconductor layers (not labeled in FIG. 18A), such as cladding layers or carrier injection layers that may be p-doped or n-doped. First reflector 1822 may include, for example, an HCG, or a DBR reflector formed by multiple pairs of dielectric, semiconductor, or metallic material layers (doped or undoped) of different refractive indices and thicknesses, such as GaAs and AlAs (or AlGaAs) layers, oxide layers (e.g., silicon oxide and another oxide layer), or the like. Active region 1824 may include, for example, InGaAs quantum well layers and GaAs barrier layers, InAlGaAs quantum well layers and AlGaAs barrier layers, or the like. In some embodiments, VCSEL 1820 may include a partial reflector 1826 for IR light, where partial reflector 1826 may partially reflect and partially transmit IR light emitted in active region 1824 to form a resonant cavity for VCSEL 1820 with first reflector 1822. The resonant cavity formed by partial reflector 1826 and first reflector 1822 may help to narrow and select the output wavelength range of the IR light emitted by IR VCSELs 1820 and improve the gain and the intensity of the emitted IR light. In some embodiments, VCSEL 1820 may include a polarizer 1828. Polarizer 1828 may be used to control the polarization mode of the IR light emitted by VCSEL 1820 and improve the coupling efficiency of the IR light into the micro-resonator by, for example, a grating coupler or nano-resonators (e.g., metastructures), which may be polarization dependent. In some embodiments, other polarization components, such as a waveplate, a spatially-variant polarizer, or a spatially-variant waveplate, may be used instead to control the polarization state of IR light emitted by VCSEL 1820.

In the illustrated example, each visible light source 1802 may include a first micro-resonator 1850, a second micro-resonator 1860, and a third micro-resonator 1870 for generating visible light of different colors using IR light emitted by VCSEL 1820 as pump light in DFWM processes. First micro-resonator 1850, second micro-resonator 1860, and third micro-resonator 1870 may have different respective designs and thus may generate visible light of different colors using the same pump light. The different respective designs may include different combinations of, for example, loop shape (e.g., ring, oval, spiral, racetrack, etc.), dimension, material (and thus refractive index), and the like. For example, the shape, dimension, and material of third micro-resonator 1870 may be selected such that red light may be generated in third micro-resonator 1870 by DFWM using the IR light emitted by VCSEL 1820 as the pump light. A coupling structure 1872 (e.g., a grating or nano-resonators) may be configured to vertically couple the red light generated in third micro-resonator 1870 out of third micro-resonator 1870. Similarly, the shape, dimension, and material of second micro-resonator 1860 may be selected such that green light may be generated in second micro-resonator 1860 by DFWM using the IR light emitted by VCSEL 1820 as the pump light. A coupling structure 1862 (e.g., a grating or nano-resonators) may be configured to vertically couple the green light generated in second micro-resonator 1860 out of second micro-resonator 1860. The shape, dimension, and material of first micro-resonator 1850 may be selected such that blue light may be generated in first micro-resonator 1850 by DFWM using the IR light emitted by VCSEL 1820 as the pump light. A coupling structure 1852 (e.g., a grating or nano-resonators) may be configured to vertically couple the blue light generated in first micro-resonator 1850 out of first micro-resonator 1850. First micro-resonator 1850, second micro-resonator 1860, and third micro-resonator 1870 may be arranged vertically in any suitable order. In some embodiments, each visible light source 1802 may include two or more different micro-resonators configured to generate visible light in two or more different colors. In some embodiments, each visible light source 1802 may include multiple micro-resonators, where at least two micro-resonators of the multiple micro-resonators may be configured to generate visible light of the same color.

The visible light coupled out of first micro-resonator 1850, second micro-resonator 1860, and third micro-resonator 1870 may be coupled out of visible light source 1802 through second reflector 1830 with little or no loss since second reflector 1830 may be anti-reflective for visible light as described above. As first reflector 1822, second reflector 1830 may include, for example, an HCG, or a DBR structure formed by multiple dielectric, semiconductor, or metallic material layers having alternating refractive indices. The thicknesses and refractive indices of the dielectric, semiconductor, or metallic material layers in the DBR structure may be selected such that IR light reflected at adjacent interfaces between different materials may constructively interfere to increase the overall reflectivity of second reflector 1830 for IR light, while visible light reflected at adjacent interfaces between different materials may destructively interfere to reduce the overall reflectivity of second reflector 1830 for visible light. As such, IR light that is emitted by VCSEL 1820 and is not coupled into the micro-resonators yet may be reflected back to the micro-resonators by second reflector 1830 and/or first reflector 1822, and may be at least partially coupled into the micro-resonators to improve the efficiency of coupling the IR pump light into the micro-resonators and the efficiency of visible light source 1802. The micro-resonators, the coupling structures, and second reflector 1830 in visible light source 1802 may be formed before or after bonding VCSEL 1820 to drive circuit 1810.

As illustrated in FIG. 18A, second reflector 1830 may be formed on MEMS device 1832 and thus may be movable by MEMS device 1832. In some embodiments, other micro-actuators or nano-actuators, such as a micro-motor, a piezoelectric actuator, a ferroelectric actuator, a magnetic actuator, an ultrasonic actuator, or the like, may be used to move second reflector 1830. The wavelength of the IR light resonant in the vertical cavity may be determined by the optical path length of the vertical cavity. Thus, when second reflector 1830 is moved by MEMS device 1832 and thus the optical path length of the vertical cavity is changed, the wavelength of the IR light that resonates in the vertical cavity may be changed. When the wavelength of the pump light is changed by tuning the optical path length of the vertical cavity using MEMS device 1832, the wavelengths of visible light of different colors generated in micro-resonators 1850, 1860, and 1870 through OPO (e.g., DFWM) processes may change as well.

In the illustrated example, visible light source 1802 may include additional electrodes for tuning the respective intensity of the visible light of each color generated by and coupled out of the corresponding micro-resonator. For example, electrodes 1890 may be used to modulate the intensity of blue light coupled out of first micro-resonator 1850, electrodes 1892 may be used to modulate the intensity of green light coupled out of second micro-resonator 1860, and electrodes 1894 may be used to modulate the intensity of red light coupled out of third micro-resonator 1870. Electrodes 1890 may be used to tune at least one of first micro-resonator 1850, the coupling structure for coupling the IR light emitted by VCSEL 1820 into first micro-resonator 1850, or coupling structure 1852 for coupling blue light generated in first micro-resonator 1850 to modulate the intensity of the blue light emitted from visible light source 1802. For example, electrodes 1890 may be used to apply a voltage on an electro-optic material or to supply a current signal to a thermo-optic device to change the refractive index of first micro-resonator 1850 or the coupling structure, thereby changing the resonant condition of first micro-resonator 1850 or the coupling efficiency of the coupling structure for first micro-resonator 1850 and thus the intensity of the emitted blue light. Similarly, electrodes 1892 may be used to change the resonant condition of second micro-resonator 1860 or the coupling efficiency of the coupling structure for second micro-resonator 1860 and thus the intensity of the emitted green light. Electrodes 1894 may be used to change the resonant condition of third micro-resonator 1870 or the coupling efficiency of the coupling structure for third micro-resonator 1870 and thus the intensity of the emitted red light. In this way, the intensities of the red, green, and blue light emitted by visible light source 1802 may be independently tuned to desired values to represent a color pixel unit for an active display panel as shown in FIG. 18B, where the pitch of visible light sources 1802 may be less than about 50 μm, less than about 30 μm, less than about 20 μm, or less than about 10 μm.

The visible light source described in FIGS. 15A-17B may use one VCSEL in a vertical cavity to generate light of multiple colors, such as the three primary colors and other colors consisting combinations of the three primary colors.

The spatial multiplexed (overlapping) visible light of different colors generated by the spatially overlapping micro-resonators in visible light sources 1502 and 1602 or the temporal combination of light of different colors generated by a single micro-resonator in visible light sources 1700 during different time periods may be perceived by a viewer's eye as a single color in a color gamut. Therefore, an array of visible light source including visible light sources described in FIGS. 15A-17B can have a smaller pixel size and a smaller pixel pitch than visible light sources described in FIGS. 14A-14B where a color pixel may be achieved by a spatial combination of three visible light sources of different primary colors.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 19:
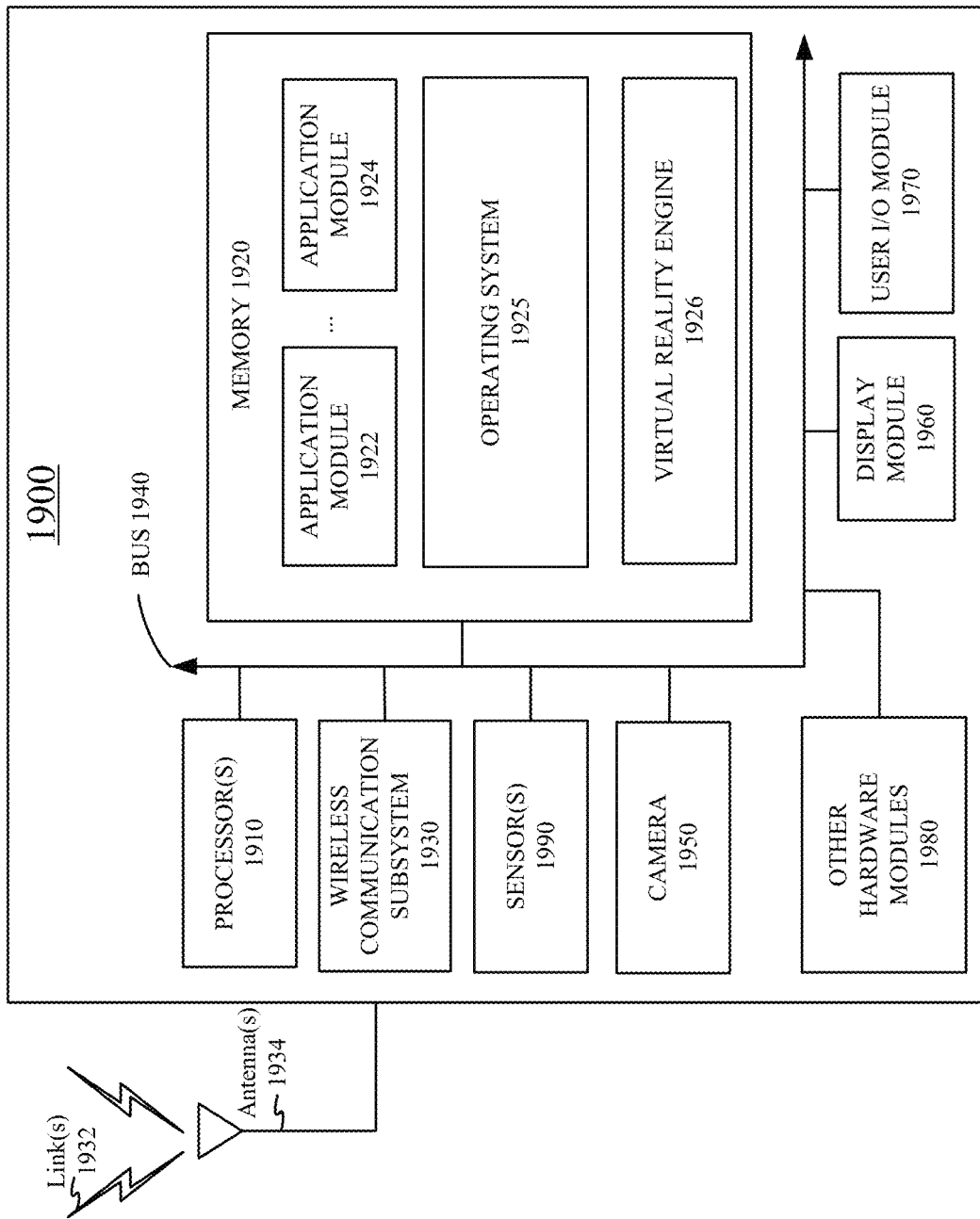
FIG. 19 is a simplified block diagram of an electronic system of an example of a near-eye display according to certain embodiments.

FIG. 19 is a simplified block diagram of an example electronic system 1900 of an example near-eye display (e.g., HMD device) for implementing some of the examples disclosed herein. Electronic system 1900 may be used as the electronic system of an HMD device or other near-eye displays described above. In this example, electronic system 1900 may include one or more processor(s) 1910 and a memory 1920. Processor(s) 1910 may be configured to execute instructions for performing operations at a number of components, and can be, for example, a general-purpose processor or microprocessor suitable for implementation within a portable electronic device. Processor(s) 1910 may be communicatively coupled with a plurality of components within electronic system 1900. To realize this communicative coupling, processor(s) 1910 may communicate with the other illustrated components across a bus 1940. Bus 1940 may be any subsystem adapted to transfer data within electronic system 1900. Bus 1940 may include a plurality of computer buses and additional circuitry to transfer data.

Memory 1920 may be coupled to processor(s) 1910. In some embodiments, memory 1920 may offer both short-term and long-term storage and may be divided into several units. Memory 1920 may be volatile, such as static random access memory (SRAM) and/or dynamic random access memory (DRAM) and/or non-volatile, such as read-only memory (ROM), flash memory, and the like. Furthermore, memory 1920 may include removable storage devices, such as secure digital (SD) cards. Memory 1920 may provide storage of computer-readable instructions, data structures, program modules, and other data for electronic system 1900. In some embodiments, memory 1920 may be distributed into different hardware modules. A set of instructions and/or code might be stored on memory 1920. The instructions might take the form of executable code that may be executable by electronic system 1900, and/or might take the form of source and/or installable code, which, upon compilation and/or installation on electronic system 1900 (e.g., using any of a variety of generally available compilers, installation programs, compression/decompression utilities, etc.), may take the form of executable code.

In some embodiments, memory 1920 may store a plurality of application modules 1922 through 1924, which may include any number of applications. Examples of applications may include gaming applications, conferencing applications, video playback applications, or other suitable applications. The applications may include a depth sensing function or eye tracking function. Application modules 1922-1924 may include particular instructions to be executed by processor(s) 1910. In some embodiments, certain applications or parts of application modules 1922-1924 may be executable by other hardware modules 1980. In certain embodiments, memory 1920 may additionally include secure memory, which may include additional security controls to prevent copying or other unauthorized access to secure information.

In some embodiments, memory 1920 may include an operating system 1925 loaded therein. Operating system 1925 may be operable to initiate the execution of the instructions provided by application modules 1922-1924 and/or manage other hardware modules 1980 as well as interfaces with a wireless communication subsystem 1930 which may include one or more wireless transceivers. Operating system 1925 may be adapted to perform other operations across the components of electronic system 1900 including threading, resource management, data storage control and other similar functionality.

Wireless communication subsystem 1930 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1900 may include one or more antennas 1934 for wireless communication as part of wireless communication subsystem 1930 or as a separate component coupled to any portion of the system. Depending on desired functionality, wireless communication subsystem 1930 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1930 may permit data to be exchanged with a network, other computer systems, and/or any other devices described herein. Wireless communication subsystem 1930 may include a means for transmitting or receiving data, such as identifiers of HMD devices, position data, a geographic map, a heat map, photos, or videos, using antenna(s) 1934 and wireless link(s) 1932. Wireless communication subsystem 1930, processor (s) 1910, and memory 1920 may together comprise at least a part of one or more of a means for performing some functions disclosed herein.

Embodiments of electronic system 1900 may also include one or more sensors 1990. Sensor(s) 1990 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1990 may include one or more IMUs and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1900 may include a display module 1960. Display module 1960 may be a near-eye display, and may graphically present information, such as images, videos, and various instructions, from electronic system 1900 to a user. Such information may be derived from one or more application modules 1922-1924, virtual reality engine 1926, one or more other hardware modules 1980, a combination thereof, or any other suitable means for resolving graphical content for the user (e.g., by operating system 1925). Display module 1960 may use LCD technology, LED technology (including, for example, OLED, ILED, μ-LED, AMOLED, TOLED, etc.), light-emitting polymer display (LPD) technology, or some other display technology.

Electronic system 1900 may include a user input/output module 1970. User input/output module 1970 may allow a user to send action requests to electronic system 1900. An action request may be a request to perform a particular action. For example, an action request may be to start or end an application or to perform a particular action within the application. User input/output module 1970 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1900. In some embodiments, user input/output module 1970 may provide haptic feedback to the user in accordance with instructions received from electronic system 1900. For example, the haptic feedback may be provided when an action request is received or has been performed.

Electronic system 1900 may include a camera 1950 that may be used to take photos or videos of a user, for example, for tracking the user's eye position. Camera 1950 may also be used to take photos or videos of the environment, for example, for VR, AR, or MR applications. Camera 1950 may include, for example, a complementary metal-oxide-semiconductor (CMOS) image sensor with a few millions or tens of millions of pixels. In some implementations, camera 1950 may include two or more cameras that may be used to capture 3-D images.

In some embodiments, electronic system 1900 may include a plurality of other hardware modules 1980. Each of other hardware modules 1980 may be a physical module within electronic system 1900. While each of other hardware modules 1980 may be permanently configured as a structure, some of other hardware modules 1980 may be temporarily configured to perform specific functions or temporarily activated. Examples of other hardware modules 1980 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1980 may be implemented in software.

In some embodiments, memory 1920 of electronic system 1900 may also store a virtual reality engine 1926. Virtual reality engine 1926 may execute applications within electronic system 1900 and receive position information, acceleration information, velocity information, predicted future positions, or any combination thereof of the HMD device from the various sensors. In some embodiments, the information received by virtual reality engine 1926 may be used for producing a signal (e.g., display instructions) to display module 1960. For example, if the received information indicates that the user has looked to the left, virtual reality engine 1926 may generate content for the HMD device that mirrors the user's movement in a virtual environment. Additionally, virtual reality engine 1926 may perform an action within an application in response to an action request received from user input/output module 1970 and provide feedback to the user. The provided feedback may be visual, audible, or haptic feedback. In some implementations, processor(s) 1910 may include one or more GPUs that may execute virtual reality engine 1926.

In various implementations, the above-described hardware and modules may be implemented on a single device or on multiple devices that can communicate with one another using wired or wireless connections. For example, in some implementations, some components or modules, such as GPUs, virtual reality engine 1926, and applications (e.g., tracking application), may be implemented on a console separate from the head-mounted display device. In some implementations, one console may be connected to or support more than one HMD.

In alternative configurations, different and/or additional components may be included in electronic system 1900. Similarly, functionality of one or more of the components can be distributed among the components in a manner different from the manner described above. For example, in some embodiments, electronic system 1900 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, or the like.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims

What is claimed is:

1. A visible light source comprising:
   a substrate;
   a first reflector and a second reflector on the substrate, wherein the first reflector and the second reflector are configured to reflect infrared light and are arranged to form a cavity in a direction perpendicular to the substrate;
   an active region in the cavity, the active region configured to emit infrared light;
   a micro-resonator in a layer above the active region in the direction perpendicular to the substrate, the micro-resonator including a resonator that is formed using a nonlinear material and is configured to receive the infrared light emitted by the active region and generate visible light through optical parametric oscillation in the resonator; and
   an output coupler configured to couple the visible light generated in the micro-resonator out of the micro-resonator.

2. The visible light source of claim 1, wherein:
   the micro-resonator is in the cavity or outside the cavity; and
   the micro-resonator is configured to receive the infrared light directly or through an input coupler.

3. The visible light source of claim 2, wherein the input coupler or the output coupler includes a grating coupler, a dielectric scatterer, a metallic scatterer, or nano-resonators.

4. The visible light source of claim 3, wherein the grating coupler is slanted, apodized, chirped, or a combination thereof.

5. The visible light source of claim 1, wherein:
the micro-resonator is outside the cavity; and
the visible light source further comprises:
  a waveguide optically coupled to the micro-resonator; and
  an input coupler in the cavity or outside the cavity and configured to couple the infrared light emitted by the active region into the waveguide.

6. The visible light source of claim 5, wherein the waveguide and the micro-resonator are formed in a same material layer or are on different layers.

7. The visible light source of claim 1, wherein the micro-resonator is configured to generate the visible light through degenerate four-wave mixing (DFWM).

8. The visible light source of claim 1, wherein each of the first reflector and the second reflector comprises a high-contrast grating, or a distributed Bragg reflector that includes dielectric layers, semiconductor layers, or both.

9. The visible light source of claim 1, wherein the second reflector is anti-reflective for the visible light and is configured to transmit the visible light out of the visible light source.

10. The visible light source of claim 1, wherein the micro-resonator includes a micro-ring, a micro-disk, a waveguide-based cavity, a photonic crystal point defect cavity, a photonic-crystal ring cavity, or a plasmonic resonator.

11. The visible light source of claim 1, wherein the micro-resonator is characterized by a circular-ring shape, an oval-ring shape, an Archimedean spiral shape, another spiral shape, or a racetrack shape.

12. The visible light source of claim 1, wherein the output coupler is configured to couple the visible light into free space or couple the visible light into a photonic integrated circuit.

13. The visible light source of claim 1, further comprising:
a third reflector in the cavity, wherein the third reflector is partially reflective for the infrared light;
a polarization component in the cavity and configured to select a polarization mode of the infrared light; or
both the third reflector and the polarization component.

14. The visible light source of claim 13, wherein the polarization component includes a polarizer, a waveplate, a spatially-variant polarizer, or a spatially-variant waveplate.

15. A visible light source array comprising:
a complementary metal-oxide semiconductor (CMOS) backplane including drive circuits formed thereon; and
an array of visible light sources bonded to the CMOS backplane directly or indirectly, wherein each visible light source in the array of visible light sources is individually addressable by the drive circuits and comprises:
  a first reflector and a second reflector configured to reflect infrared light and form a cavity in a direction perpendicular to the CMOS backplane;
  an active region in the cavity and configured to emit infrared light;
  a micro-resonator in a layer above the active region in the direction perpendicular to the CMOS backplane, the micro-resonator including a resonator that is formed using a nonlinear material, is configured to resonate in a plane perpendicular to a length direction of the cavity, and is configured to receive the infrared light emitted by the active region and generate visible light through optical parametric oscillation in the resonator; and
  an output coupler configured to couple the visible light generated in the micro-resonator out of the micro-resonator.

16. The visible light source array of claim 15, wherein:
the micro-resonator is in the cavity or outside the cavity; and
the micro-resonator is configured to receive the infrared light directly or through an input coupler.

17. The visible light source array of claim 15, wherein:
the micro-resonator is outside the cavity; and
each visible light source in the array of visible light sources further comprises:
  a waveguide optically coupled to the micro-resonator; and
  an input coupler in the cavity or outside the cavity and configured to couple the infrared light into the waveguide.

18. The visible light source array of claim 15, wherein the micro-resonator includes a micro-ring, a micro-disk, a waveguide-based cavity, a photonic crystal point defect cavity, a photonic-crystal ring cavity, or a plasmonic resonator.

19. The visible light source array of claim 15, wherein a pitch of the visible light source array is less than 50 µm, less than 30 µm, less than 20 µm, or less than 10 µm.

20. The visible light source array of claim 15, wherein the micro-resonator is characterized by a circular-ring shape, an oval-ring shape, a spiral shape, or a racetrack shape.

* * * * *